(12) United States Patent
Huber et al.

(10) Patent No.: US 10,541,479 B2
(45) Date of Patent: Jan. 21, 2020

(54) INTERCONNECTION INCLUDING A CABLE ASSEMBLY AND A BOARD ASSEMBLY, A BOARD ASSEMBLY FOR AN INTERCONNECTION AND A METHOD FOR MAKING AN INTERCONNECTION

(71) Applicant: MD ELEKTRONIK GmbH, Waldkraiburg (DE)

(72) Inventors: Martin Huber, Obing (DE); Robert Hofmann, Truchtlaching (DE)

(73) Assignee: MD ELEKTRONIK GMBH, Waldkraiburg (DE)

( * ) Notice: Subject to any disclaimer, the term of this patent is extended or adjusted under 35 U.S.C. 154(b) by 0 days.

(21) Appl. No.: 16/029,693

(22) Filed: Jul. 9, 2018

(65) Prior Publication Data
US 2019/0036245 A1    Jan. 31, 2019

(30) Foreign Application Priority Data
Jul. 25, 2017    (EP) ..................................... 17183028

(51) Int. Cl.
*H01R 12/53*    (2011.01)
*H01R 4/02*    (2006.01)
(Continued)

(52) U.S. Cl.
CPC ............... *H01R 12/53* (2013.01); *H01R 4/02* (2013.01); *H01R 43/0256* (2013.01);
(Continued)

(58) Field of Classification Search
CPC ........ H01R 12/53; H01R 12/59; H01R 12/61; H05K 1/183
See application file for complete search history.

(56) References Cited

U.S. PATENT DOCUMENTS 6,980,068 B2 *  12/2005  Miyazawa ............. H01P 1/047
                                                            333/246
2001/0042907 A1   11/2001  Tamaki et al.
(Continued)

FOREIGN PATENT DOCUMENTS

DE     202014008843 U1   11/2014
EP           1154512 A2   11/2001
WO     WO 2006067028 A2    6/2006

*Primary Examiner* — Jeremy C Norris
(74) *Attorney, Agent, or Firm* — Leydig, Voit & Mayer, Ltd.

(57) ABSTRACT

An interconnection includes a cable assembly and a board assembly. The cable assembly includes a cable having an inner conductor. The board assembly comprises an intermediate layer disposed between first and second outer layers, a recess disposed between the first and second outer layers so as to form a cable-receiving space at a first side edge, and a first inner-conductor contact opening extending through at least one of the first and second outer layers and opening into the cable-receiving space. The inner conductor is inserted at the first side edge into the cable-receiving space and is disposed at an offset in a longitudinal direction relative to the first inner-conductor contact opening. The inner conductor is electrically conductively soldered via a first soldered inner-conductor connection to a first inner-conductor connection region of the first and/or second outer layers, at least in a region of the first inner-conductor contact opening.

19 Claims, 13 Drawing Sheets

(51) Int. Cl.
    *H01R 43/02*    (2006.01)
    *H05K 1/18*     (2006.01)
    *H05K 3/00*     (2006.01)
    *H05K 3/34*     (2006.01)
    *H01R 12/70*    (2011.01)
    *H01R 24/50*    (2011.01)

(52) U.S. Cl.
    CPC ........... H05K 1/183 (2013.01); H05K 3/0044 (2013.01); H05K 3/34 (2013.01); *H01R 12/7023* (2013.01); *H01R 24/50* (2013.01); *H05K 2201/09036* (2013.01); *H05K 2201/10356* (2013.01); *H05K 2201/10393* (2013.01); *H05K 2203/0475* (2013.01)

(56) References Cited

U.S. PATENT DOCUMENTS

| | | |
|---|---|---|
| 2006/0281343 A1 | 12/2006 | Uchida et al. |
| 2013/0231011 A1 | 9/2013 | Sytsma et al. |
| 2017/0317439 A1 | 11/2017 | Zebhauser et al. |

\* cited by examiner

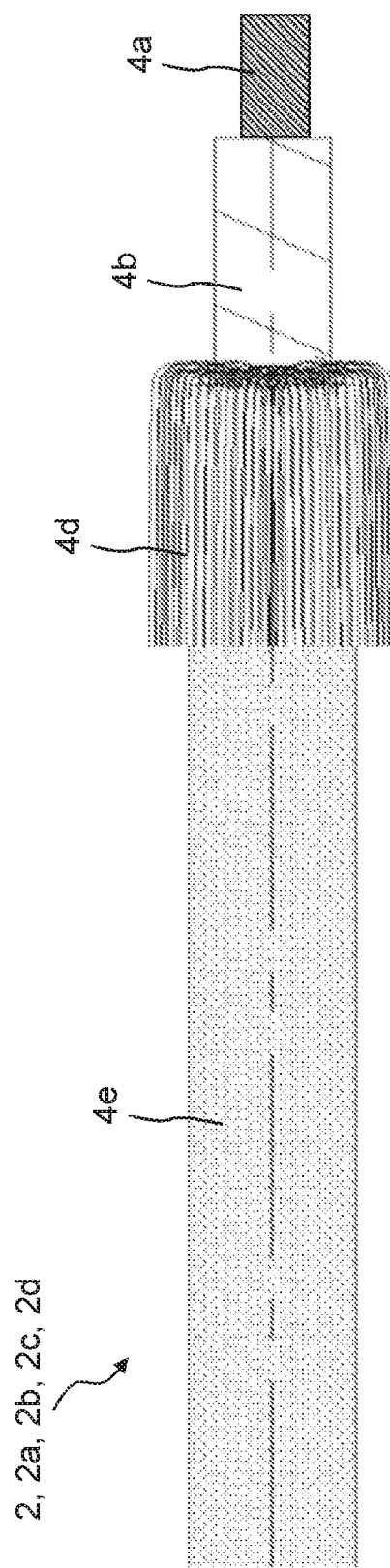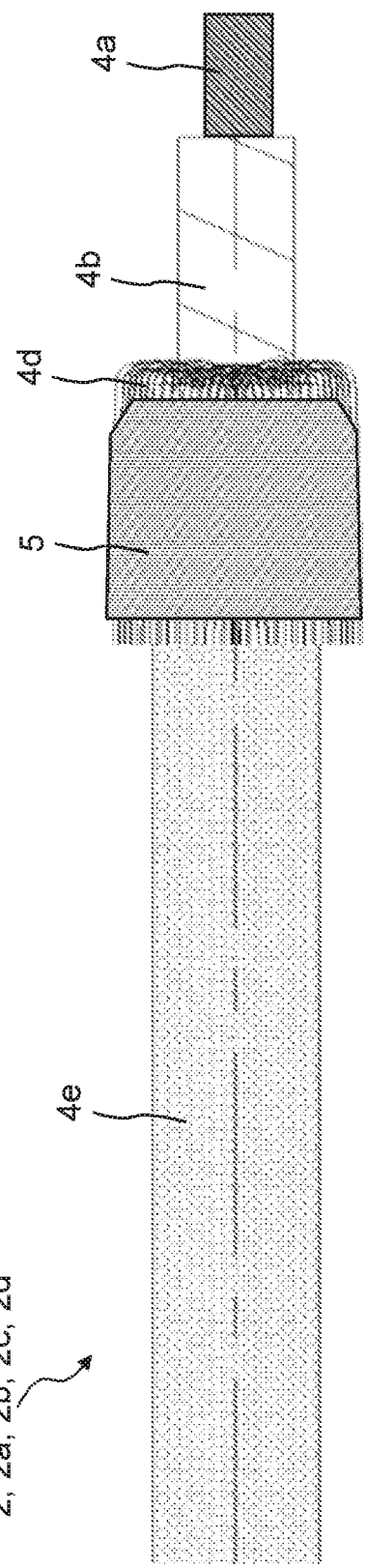
Fig. 2A
Fig. 2B

INTERCONNECTION INCLUDING A CABLE ASSEMBLY AND A BOARD ASSEMBLY, A BOARD ASSEMBLY FOR AN INTERCONNECTION AND A METHOD FOR MAKING AN INTERCONNECTION

CROSS-REFERENCE TO PRIOR APPLICATIONS

Priority is claimed to European Patent Application No. EP 17183028.4, filed on Jul. 25, 2017, the entire disclosure of which is hereby incorporated by reference herein.

FIELD

The present invention relates to an interconnection including a cable assembly and a board assembly, as well as a board assembly for this interconnection, as well as a method for making such an interconnection.

Such an interconnection provides an efficient way to electrically and mechanically connect a cable, in particular a coaxial cable, to a circuit board (board assembly). One may also speak of a high-speed data (HSD) interconnection via which, preferably, low-voltage differential signaling (LVDS) signals, such as, inter alia, USB signals or display signals, are transmitted.

BACKGROUND

As structures become increasingly smaller, ways of connecting a single wire or multiple wires of a cable to a connector, in particular to a PCB, have become a central issue. With increasingly higher data rates, there are increasing limitations to what is achievable with high process reliability in a standard soldering process in manual production. Moreover, with these higher data rates, it is of increased importance that, from an electrical point of view, the spacing of the conductive traces in relation to the single wire is small and as symmetric as possible and.

In this context, different variants of connectors are known. Some of these connectors are suitable for connection on PCBs; i.e., circuit boards. These are generally angled 90°, so that the connecting cable can be routed parallel to the circuit board. In this connection, reference is made to DE 20 2014 008 843 U1, which shows a circuit board and a corresponding connector. This connector is soldered to the circuit board and is suitable for connection to a connecting cable.

US 2013/0231011 A1 also describes an interconnection via which the inner conductors of a plurality of cables are soldered to different circuit boards. In that approach, the cables are arranged side by side and on top of one another and do not have an outer conductor. Inner conductors which are disposed side by side are soldered to corresponding contact pads on a first side of a circuit board, whereas inner conductors of cables located thereabove or therebelow are soldered to a second, opposite side of this circuit board. In total, there are two circuit boards, both sides of each of these circuit boards being soldered to corresponding cables, and the two circuit boards being separated from each other by a fastening element.

The inventors have recognized that problems of US 2013/0231011 A1 are that the process of soldering the inner conductors of the cables to the corresponding top and bottom sides of the respective circuit boards and the process of making the interconnection are difficult to automate, and that the individual inner conductors are disposed without shielding.

SUMMARY

In an embodiment, the present invention provides an interconnection having a cable assembly and a board assembly. The cable assembly includes at least one first cable, the first cable having an inner conductor. The board assembly comprises: at least three layers stacked on each other in a longitudinal direction, the at least three layers including an intermediate layer and first and second outer layers, the intermediate layer being disposed between the first outer layer and the second outer layer, the at least three layers being directly or indirectly joined together, at least one of the first and second outer layers being electrically conductive, and the intermediate layer including a dielectric material; a recess disposed between the first outer layer and the second outer layer so as to form a cable-receiving space at a first side edge of the board assembly; and at least one first inner-conductor contact opening extending through at least one of the first and second outer layers and opening into the cable-receiving space. The inner conductor of the at least one first cable is inserted at the first side edge into the cable-receiving space and is disposed at an offset in the longitudinal direction relative to the at least one first inner-conductor contact opening. The inner conductor of the at least one first cable is electrically conductively soldered via a first soldered inner-conductor connection to a first inner-conductor connection region of at least one of the first and second outer layers, at least in a region of the first inner-conductor contact opening.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIGS. 2A and 2B show various steps illustrating how the cable assembly in the form of a coaxial cable is prepared, particularly how the inner and outer conductors must be conditioned to allow making an interconnection;

DETAILED DESCRIPTION

Figure 1A:
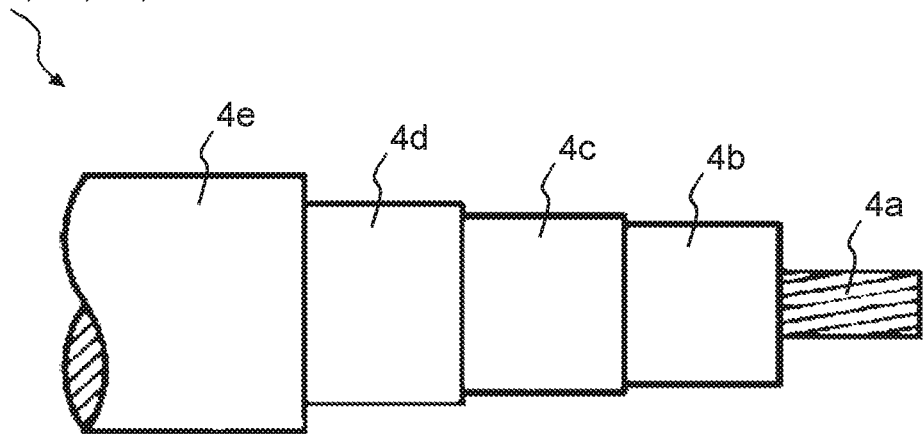
FIGS. 1A and 1B illustrate exemplary configurations of a cable assembly including a coaxial cable and, for example, an HSD cable.

An embodiment of the present invention provides an interconnection including a cable assembly and a board assembly, which interconnection allows the individual cables, in particular the inner conductors, to be connected within a minimum of space, and at the same time to allows for an automated manufacturing process. Also, the interconnection is inexpensive, yet has electrical properties equal to or even better than the interconnections of the prior art.

The interconnection according to an embodiment of the present invention includes a cable assembly and exactly one board assembly (e.g. a circuit board). The board assembly includes at least three layers stacked on each other in the longitudinal direction, an intermediate layer being disposed between a first outer layer and a second outer layer, and all three layers being directly or indirectly joined together. If joined directly, there are no other additional layers between the respective outer layer and the intermediate layer. However, if joined indirectly, one or more additional layers may be incorporated. The wording "joined together" is understood to mean a mechanical connection created in particular by gluing and/or pressing the layers together. The individual layers can in particular only be separated by destroying the board assembly. The first outer layer and/or the second outer layer are/is electrically conductive, whereas the intermediate layer is made of or includes a dielectric. The two outer layers are basically galvanically isolated from each other, but may be electrically interconnected by suitable electrical through-connections (vias—vertical interconnect accesses).

The board assembly further includes a recess between the first outer layer and the second outer layer, whereby a cable-receiving space is formed at a first side edge or side edge region of the board assembly. At least one first inner-conductor contact opening extends through the first outer layer and/or the second outer layer and opens into the cable-receiving space. The at least one first inner-conductor contact opening preferably extends through both outer layers, but at least through the outer layer that is made of an electrically conductive material.

The cable assembly includes at least one first cable, the first cable having an electrically conductive inner conductor. The inner conductor of the at least one first cable is inserted through the first side edge or side edge region into the first cable-receiving space and, when viewed in a plan view looking at the first or second outer layer, is disposed below the at least one first inner-conductor contact opening. This means that the inner conductor of the at least one first cable is disposed at an offset in the longitudinal direction relative to the at least one first inner-conductor contact opening. The inner conductor of the at least one first cable is electrically conductively soldered via a first soldered inner-conductor connection to a first inner-conductor connection region of the first and/or second outer layer(s), at least in the region of the first inner-conductor contact opening.

It is particularly advantageous that the board assembly, which, in particular, is a circuit board (e.g., FR4), has a recess in its dielectric layer; i.e., in the intermedia layer, into which recess is inserted at least the inner conductor of the cable. Particularly preferably, the inner conductor is electrically conductively soldered to one or both outer layer(s), thereby achieving an optimized RF connection with a small impedance mismatch. The circuit board may be made from standard laminate PCB substrates, which allows for particularly cost-effective manufacture. In the case that both outer layers are electrically conductive, the exposed inner conductor is, in addition, effectively electrically shielded.

In a preferred embodiment of the interconnection, the first soldered inner-conductor connection is formed from a heated inner-conductor solder deposit which is disposed, for example, in the at least one first inner-conductor contact opening and/or on the inner conductor of the at least one first cable below the at least one first inner-conductor contact opening. The inner-conductor solder deposit may be very easily placed into the inner-conductor contact opening using a dispenser unit and may be melted by a soldering process, whereupon it bonds to the inner conductor. The soldering process may be accomplished using a normal soldering tip or an inductive soldering process.

In another preferred embodiment, at least one subunit, the first cable further includes an electrically conductive outer conductor which is galvanically isolated from the inner conductor by a dielectric. The board assembly further includes a first outer-conductor contact opening which extends through the first outer layer and/or the second outer layer and also opens into the cable-receiving space. The first outer-conductor contact opening is disposed closer to the first side edge or side edge region than the first inner-conductor contact opening. The outer conductor of the at least one first cable is inserted at the first side edge into the cable-receiving space and, when viewed in a plan view looking at the first or second outer layer, is disposed below the at least one first outer-conductor contact opening. This means that the outer conductor of the at least one first cable is disposed at an offset in the longitudinal direction relative to at least one first outer-conductor contact opening. The outer conductor of the at least one first cable is electrically conductively soldered via a first soldered outer-conductor connection to an outer-conductor connection region of the first and/or second outer layer(s), at least in the region of the first outer-conductor contact opening. The first inner-conductor connection region is galvanically isolated from the first outer-conductor connection region. It is particularly advantageous in this connection that the outer conductor of the at least one first cable can be connected to the board assembly as easily as the inner conductor. Thus, coaxial cables can particularly easily be electrically conductively connected to a board assembly; i.e., to a circuit board, in such an interconnection.

In another embodiment, the cable assembly further includes at least one second cable having an electrically conductive inner conductor. The at least two cables are arranged side by side. In particular, in the cable-receiving space, all cables of the cable assembly lie in the same plane which, in turn, extends parallel to the board assembly; i.e., to the individual layers of the board assembly. A second inner-conductor contact opening is disposed correspondingly to the first inner-conductor contact opening, whereas the inner conductor of the at least one second cable, when viewed in a plan view looking at the first or second outer layer, is disposed below the at least one second inner-conductor contact opening. This means that the inner conductor of the at least one second cable is disposed at an offset in the longitudinal direction relative to at least one second inner-conductor contact opening. A second soldered inner-conductor connection provides a galvanic connection between the inner conductor of the second cable and a second inner-conductor connection region of the first and/or second outer layer(s). The two inner-conductor connections of the two cables are galvanically isolated from each other. This is achieved, in particular, either by connecting the two inner conductors to different outer layers or by connecting them to the same outer layer or layers, with the outer layer or layers being divided into different inner-conductor connection regions which, in turn, are galvanically isolated from each other. When a circuit board is used, the individual inner conductors of the at least two cables are galvanically soldered to different signal lines on the circuit board.

Particularly preferably, the second cable also has a corresponding, electrically conductive outer conductor which, like the outer conductor of the first cable, is soldered to the board assembly.

Further preferably, the cable assembly of the interconnection further includes a cable-collecting and aligning device including a main body. The cable-collecting and aligning device is made of or includes a plastic material. The cable-collecting and aligning device is preferably immovably disposed on the first cable or all cables, respectively. It serves to position the individual cables in a specific alignment and angular position relative to each other. The cable-collecting and aligning device includes at least one fastening device formed on the main body. The fastening device serves to secure the cable-collecting and aligning device to the board assembly in such a manner that the at least one cable or all cables is/are disposed in a fixed position within the cable-receiving space. When such a cable-collecting and aligning device is used, the individual cables assume a specific alignment and angular position, which allows multiple cables arranged side by side to be simultaneously inserted into the cable-receiving space. The cable-collecting and aligning device also serves, by its fastening device, as a strain relief, so that the individual soldered connections are not damaged by tensile forces exerted on the cables.

The board assembly according to an embodiment of the present invention is used to create an interconnection and, as described earlier, includes three layers stacked on each other in the longitudinal direction and mechanically fixedly connected together, an intermediate layer being disposed between a first and a second outer layer. The first outer layer and the second outer layer are electrically conductive, and the intermediate layer includes a dielectric material, the board assembly having a recess between the two outer layers, whereby a cable-receiving space is formed. At least one first inner-conductor contact opening extends through the first outer layer and/or the second outer layer and opens into the cable-receiving space. At least one first inner-conductor solder deposit is disposed in the first inner-conductor contact opening. Such a board assembly is particularly advantageous because the first inner-conductor solder deposit can be deposited very easily and allows soldered connections to be formed in a targeted manner between the first or second outer layer and the inner conductor of the cable to be connected.

The method according to an embodiment of the present invention for making such an interconnection includes various steps. In a first step, a board assembly is produced which includes at least three layers stacked on each other in the longitudinal direction, a dielectric intermediate layer being provided between a first and a second outer layer. The first and/or second outer layer are/is electrically conductive. A first recess is formed between the two outer layers, whereby a cable-receiving space is formed at a first side edge or side edge region of the board assembly.

In a second step, at least one first inner-conductor contact opening is formed into the board assembly, this first inner-conductor contact opening extending through the first outer layer and/or the second outer layer and opening into the cable-receiving space. Generally, this step may also be performed prior to creating the recess.

In a third step, at least the inner conductor (and possibly also the outer conductor) of the at least one first cable of the cable assembly is exposed. Of course, this step may also be performed prior to the first or second step.

In a fourth step, at least one first inner-conductor solder deposit is placed into the inner-conductor contact opening and/or attached to the exposed inner conductor of the at least one first cable.

In a fifth step, the inner conductor of the at least one first cable is inserted at the first side edge into the cable-receiving space, so that, when viewed in a plan view looking at the first or second outer layer, the inner conductor of the at least one first cable is disposed below the at least one first inner-conductor contact opening.

In a sixth step, the at least one first inner-conductor solder deposit is heated until it is molten and electrically conductively connects the inner conductor of the at least one first cable via a first soldered inner-conductor connection to a first inner-conductor connection region of the first and/or second outer layer(s), at least in the region of the first inner-conductor contact opening. Of particular advantage here is that the at least one first inner-conductor solder deposit to be placed into the inner-conductor contact opening may be incorporated at any point in the manufacturing process. This means that the respective board assembly may be prepared long before the interconnection is made. The method can be performed in a fully automated fashion, which makes it possible to produce an increased number of units at lower cost and with improved electrical properties.

Various exemplary embodiments of the present invention are described below, by way of example, with reference to the drawings, wherein identical parts are identified by identical reference numeral.

The following describes how an inventive interconnection 1 may be made between a cable assembly 2 and a board assembly 3. Various specific embodiments of cable assembly 2 are shown, inter alia, in FIGS. 1A, 1B, 2A and 2B, while different exemplary embodiments of board assembly 3 are illustrated in FIGS. 3A through 3E.

Figure 1B:
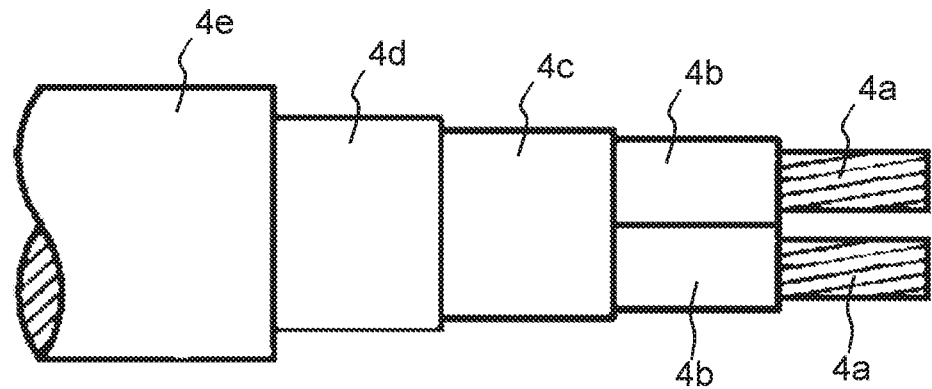

FIGS. 1A and 1B depict different exemplary embodiments of cable assembly 2. The cable assembly includes at least one first cable 2a, 2b, 2c, 2d. First cable 2a is preferably shielded in order to enhance immunity to noise, on the one hand, and to reduce electromagnetic emissions, on the other. In FIG. 1A, the (shielded) first cable 2a of cable assembly 2 is illustrated in the form of a coaxial cable. The coaxial cable includes an inner conductor 4a made of or includes an electrically conductive material such as, for example, copper. Inner conductor 4a of first cable 2a is surrounded by a dielectric 4b made of an electrical insulator, in particular an (elastic) plastic material. Optionally, dielectric 4b may further be surrounded by a shielding film 4c, which preferably includes a dielectric material, in particular a plastic film (e.g., PET film) having a metal vapor-deposited or sputtered thereon. This metal may be, for example, aluminum and preferably has a layer thickness of 10 µm to 20 µm. Further, outer conductor 4d is placed on this optional shielding film 4c. This outer conductor includes in particular shield wires, which may also be referred to as a shielding braid. These shield wires are made of a metal and are electrically conductive. While the use of an outer conductor 4d is advantageous, it is not mandatory. Further, an outer sheath 4e preferably made of an (elastic) dielectric, such as plastic, is disposed around outer conductor 4d. Altogether, there may be several such cables 2a, 2b, 2c, 2d, etc., as shown, for example, in FIG. 8D, which will be discussed later herein. Each of these cables 2a, 2b, 2c, 2d includes at least inner conductor 4a, dielectric 4b surrounding inner conductor 4a, outer conductor 4d, and outer sheath 4e.

Cable assembly 2 of FIG. 1A may also include an unshielded twisted pair (UTP) cable. In this case, shielding film 4c and outer conductor 4d are omitted, and outer sheath 4e is only optionally provided. This is because, in the case of an USB connection, the cable connection may also be implemented using UTP single wire.

A plurality of cables 2a, 2b, 2c, 2d may share the same shielding film 4c, outer conductor 4d and outer sheath 4e. Such a configuration of cable assembly 2 is shown in FIG. 1B.

FIG. 1B shows a cable assembly 2 including a plurality of cables 2a, 2b, which form an HSD cable. Cable assembly 2 of FIG. 1B may also be a shielded twisted pair (STP) cable or a shielded parallel pair (SPP) cable or a shielded parallel quad (SPQ) cable. In an SPP cable and an SPQ cable, inner conductors 4a are not twisted, but lie side by side, parallel to one another under shielding film 4c. Thus, cable assembly 2 is not limited to a coaxial cable or an HSD cable. Each of these cables 2a, 2b includes an inner conductor 4a and a dielectric 4b surrounding inner conductor 4a. Here, in contrast to FIG. 1A, an (optional) common shielding film 4c surrounds dielectrics 4b of both cables 2a, 2b. This common shielding film 4c has wound therearound a common outer conductor 4d which, in turn, is surrounded by a common outer sheath 4e. Such a configuration allows higher data throughput, in particular when a differential signal, such as a low voltage differential signaling (LVDS) signal, is used.

In principle, cable 2a, 2b, 2c, 2d could also only include inner conductor 4a and outer sheath 4e surrounding inner conductor 4a.

As mentioned in the introduction, it is an object of this invention to provide an interconnection 1 and a corresponding method for making this interconnection 1, whereby a cable assembly 2 including one or more cables 2a, 2b, 2c, 2d can be connected to a board assembly 3 in the most automated manner possible. To this end, it is necessary to expose certain layers of cables 2a, 2b, 2c, 2d, which layers electrically contact different connection regions of board assembly 3.

This will be explained in more detail with reference to FIGS. 2A and 2B. FIG. 2A shows a cable 2a, 2b, 2c, 2d of cable assembly 2 in the form of a coaxial cable, whose configuration was already described in FIG. 1A, to which reference is hereby made. To be able to make interconnection 1 with this cable 2a, 2b, 2c, 2d, at least individual ones of layers 4a, 4b, 4c, 4d, 4e are slit at different lengths and pulled off, whereby at least inner conductor 4a, dielectric 4b and outer conductor 4d including its shielding braid become visible. The shield wires of outer conductor 4d are folded over; i.e., folded back away from exposed inner conductor 4a, and optionally shortened (e.g., using a laser or a knife). Dielectric 4b also protrudes a certain length from outer conductor 4d. The same applies to inner conductor 4a with respect to dielectric 4b. No shielding film 4c is present, or has already been completely removed.

FIG. 2B further shows a metal foil 5 which surrounds; i.e., is wrapped around, outer conductor 4b, and thus in particular around the braided shield or the major portion of the exposed braided shield of outer conductor 4d. This metal foil 5 ensures that the individual shield wires remain in a fixed position while making interconnection 1 and also thereafter, and that no undesired electrical contact is made (e.g., to inner conductor 4a of a cable 2a, 2b, 2c, 2d).

Inner conductor 4a of at least one cable 2a, 2b, 2c, 2d is a stranded conductor, whose strands are preferably soldered together in a solder bath, thus preventing them from projecting from the other strands that form the actual inner conductor 4a and causing unwanted electrical contact.

Figure 3A:
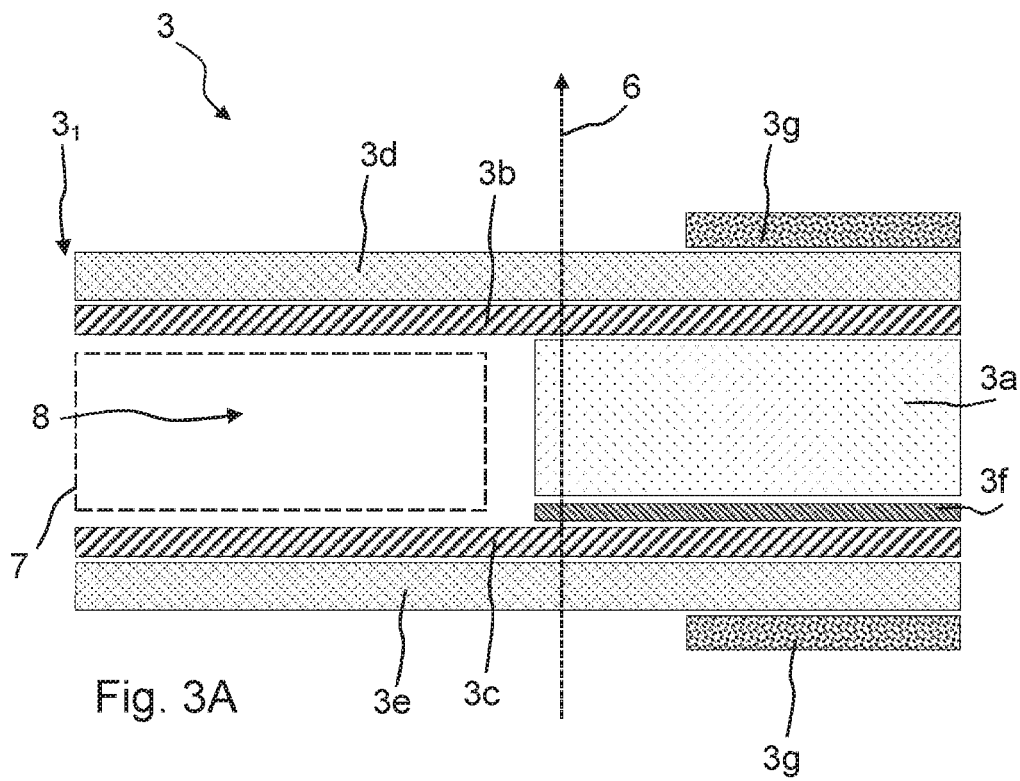
FIGS. 3A, 3E depict simplified cross-sectional views of different exemplary embodiments of a board assembly which may contact an inner conductor of a cable.

In order to make the inventive interconnection 1, cable assembly 2 is connected to board assembly 3. A simplified (longitudinal) cross-sectional view through board assembly 3 is shown in FIGS. 3A and 3E, for example. Board assembly 3 is in particular a circuit board or PCB having circuit carriers in the form of chips disposed thereon, in particular soldered thereto. Preferably, board assembly 3 includes at least two metal layers, which means that the conductive traces and circuit carriers extend or can be mounted on both sides of the circuit board.

Board assembly 3 includes at least three layers 3a, 3b, 3c stacked on each other in longitudinal direction 6. An intermediate layer 3a is disposed between a first outer layer 3b and a second outer layer 3c. All three layers 3a, 3b, 3c are directly or indirectly joined together, in particular glued and/or pressed together. Intermediate layer 3a may also be referred to as "laminate core" and is preferably made of FR4. Consequently, intermediate layer 3a is a dielectric. Depending on the desired data rate, a suitable dielectric having corresponding dielectric losses is used. The thickness (extent in longitudinal direction 6) of intermediate layer 3a is substantially equal to the diameter of inner conductor 4a of the at least one cable 2a through 2d. The wording "substantially equal" should be understood to mean that the diameter of inner conductor 4a is preferably less than 40%, 30%, 20%, 10% smaller than the thickness of intermediate layer 3a. The thickness of intermediate layer 3a is preferably less than 3 mm, 2 mm, 1 mm, 0.7 mm, 0.6 mm, 0.5 mm. Depending on the diameter of inner conductor 4a, the thickness of intermediate layer 3a may be selected accordingly.

First outer layer 3b is preferably made of copper with a thickness of 18 µm to 35 µm. The same applies to second outer layer 3c. In this exemplary embodiment, both the first and the second outer layers 3b, 3c are electrically conductive. This is not absolutely necessary. It would suffice if one outer layer 3b, 3c were electrically conductive. Although both outer layers 3b, 3c electrically conductive, they are divided into different connection regions which are not galvanically interconnected, as will be explained in greater detail further below. In this context, the wording "layer" is intended to mean merely a sheet, which does not have to be continuous along board assembly 3 and, in particular, does not have to be at the same electrical potential.

In this exemplary embodiment, board assembly 3 further includes a first and a second cover layer 3d, 3e. Each of these first and second cover layers is preferably a (flexible) solder stop layer which prevents the solder from spreading outside of predetermined contact pads 3g during solder mounting of different electrical components (e.g., circuit carriers). The molten solder, which is used to solder the electrical components to corresponding contact pads 3g, does not come to rest on first or second cover layer 3d, 3e. Contact pads 3g may be located on first and second cover layers 3d, 3e.

In the exemplary embodiment of FIGS. 3A and 3E, there is a further inner layer 3f This further inner layer 3f is disposed between intermediate layer 3a and second outer layer 3c. Thus, second outer layer 3c is not directly, but only indirectly joined to intermediate layer 3a. The further inner layer 3f is, for example, a layer of polyimide. Preferably, this layer has a thickness of 20 µm to 50 µm.

The layer thicknesses plotted are selected merely by way of example. In reality, intermediate layer 3a will have the greatest thickness. Intermediate layer 3a is preferably thicker than the first and/or second outer layer 3b, 3c alone, or greater than the two outer layers 3b, 3c together. Preferably, intermediate layer 3a is thicker than all other layers 3b through 3f together.

Board assembly 3 further includes a recess 7 between first outer layer 3b and second outer layer 3c, shown by a dashed line in FIG. 3A. This recess 7 defines a cable-receiving space 8, which is formed at a first side edge $3_1$ of board assembly 3. As will be explained further below, certain portions of cables 2a through 2d, in particular their exposed inner conductors 4a and, additionally, their outer conductors 4d, are inserted into this cable-receiving space 8. Therefore, this cable-receiving space 8 is accessible from outside of board assembly 3 if no interconnection 1 has been created between cable assembly 2 and board assembly 3 by inserting the individual cables 2a through 2d into cable-receiving space 8.

Recess 7 is preferably formed by a mechanical machining process, in particular by milling and/or drilling, at least in intermediate layer 3a. Recess 7 could also be made merely by using less material for intermediate layer 3a and the further inner layer 3f during assembly of the individual layers 3a through 3f, whereby the first and second outer layers 3b, 3c would project beyond intermediate layer 3a at first side edge 3i. In this case, no milling and/or drilling process would be required. Certain portions of intermediate layer 3a and inner layer 3f could also be punched out or cut off prior to gluing and/or pressing board assembly 3 together.

Recess 7 of board assembly 3 is accessible to cable assembly 2 only from the side of board assembly 3 and not from above or below. This means that recess 7 is accessible only with a motion vector parallel to, or having a component mainly parallel to, the individual layers 3a through 3f.

In contrast to FIG. 3A, FIG. 3E further shows at least one first inner-conductor contact opening 9a which extends through first outer layer 3b and/or second outer layer 3c and opens into cable-receiving space 8. The at least one first inner-conductor contact opening 9a preferably extends through both outer layers 3b, 3c. In this case, inner-conductor contact opening 9a is preferably an electrical through-connection (via—vertical interconnect access). Therefore, inner-conductor contact opening 9a preferably extends perpendicular to the individual layers 3a through 3f; i.e., parallel to longitudinal direction 6. An inner wall 10 of first inner-conductor contact opening 9a is preferably plated with a metal coating.

In most of the drawing figures, this first inner-conductor contact opening 9a extends only through the two outer layers 3b, 3c and the two cover layers 3d, 3e. In contrast, in FIGS. 4D and 8C, it is shown that intermediate layer 3a also bounds recess 7 along longitudinal direction 6 and was not completely removed. This means that recess 7 extends only over part of the total thickness of intermediate layer 3a, as a result of which intermediate layer 3a includes two spaced-apart portions 11a, 11b extending parallel to outer layers 3b, 3c. First portion 11a is disposed at first outer layer 3b and second portion 11b is disposed at second outer layer 3c. These two portions 11a, 11b of intermediate layer 3a bound cable-receiving space 8 in longitudinal direction 6. The at least one first inner-conductor contact opening 9a extends also through these portions 11a, 11b of intermediate layer 3a. Preferably, inner wall 10 thereof is also plated; i.e., electrically conductive.

The diameter of the at least one first inner-conductor contact opening 9a is preferably smaller than the diameter of inner conductor 4a of a cable 2a through 2d. First inner-conductor contact opening 9a is preferably disposed closer to the rear end of recess 7 than to the front end of recess 7, the front end of receiving space 7 being located or beginning at first side edge $3_1$. However, the at least one first inner-conductor contact opening 9a could also be located in the middle or in the first half (closer to first side edge $3_1$) with respect to the length of recess 7.

Figure 3B:
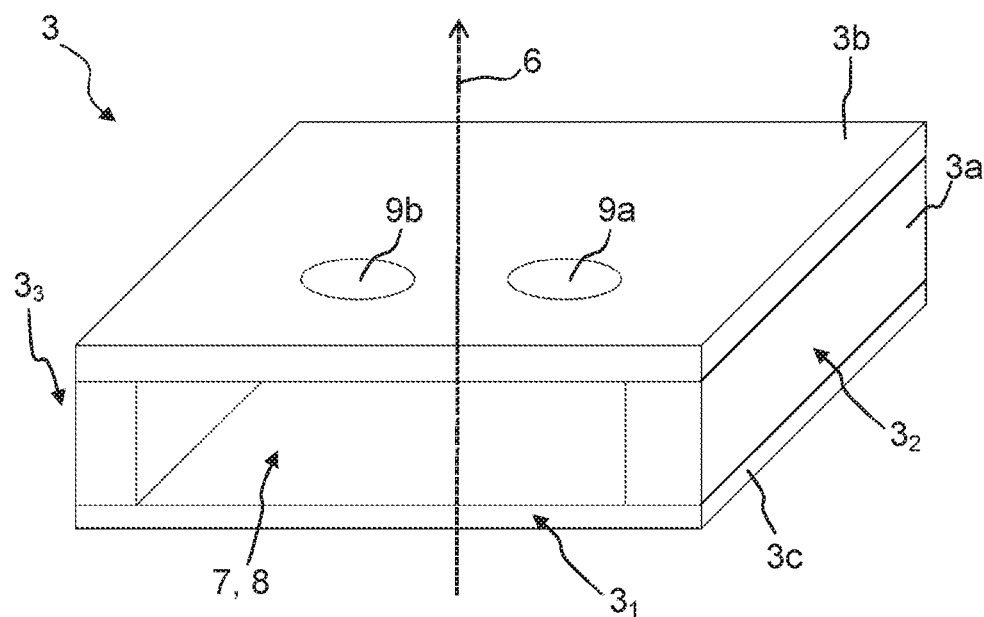
FIGS. 3B, 3C, 3D show simplified spatial representations of the board assembly.
Figure 3C:
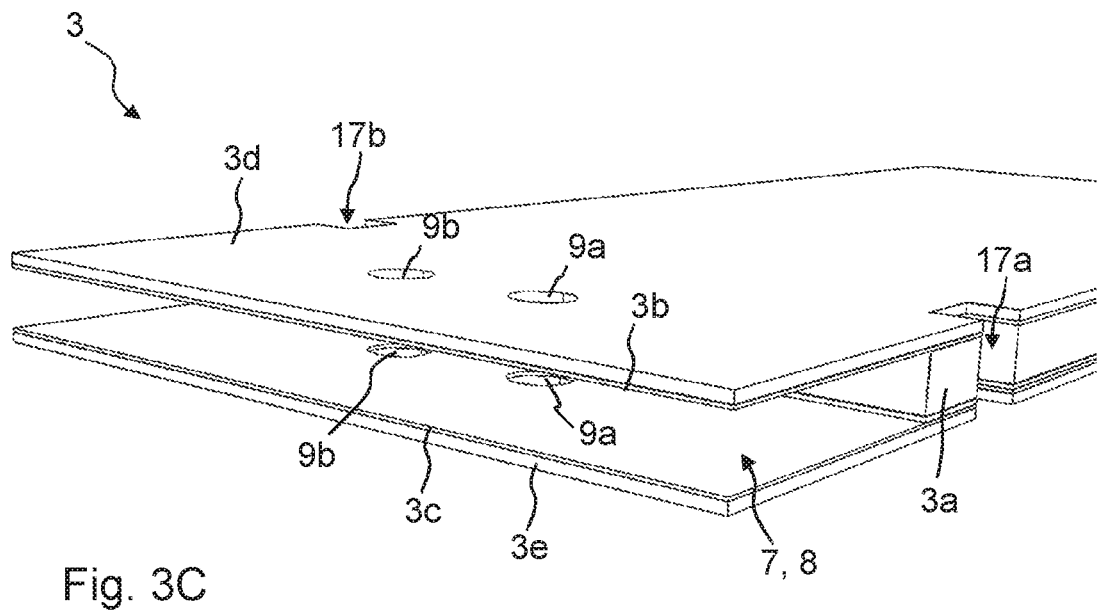
Figure 3D:
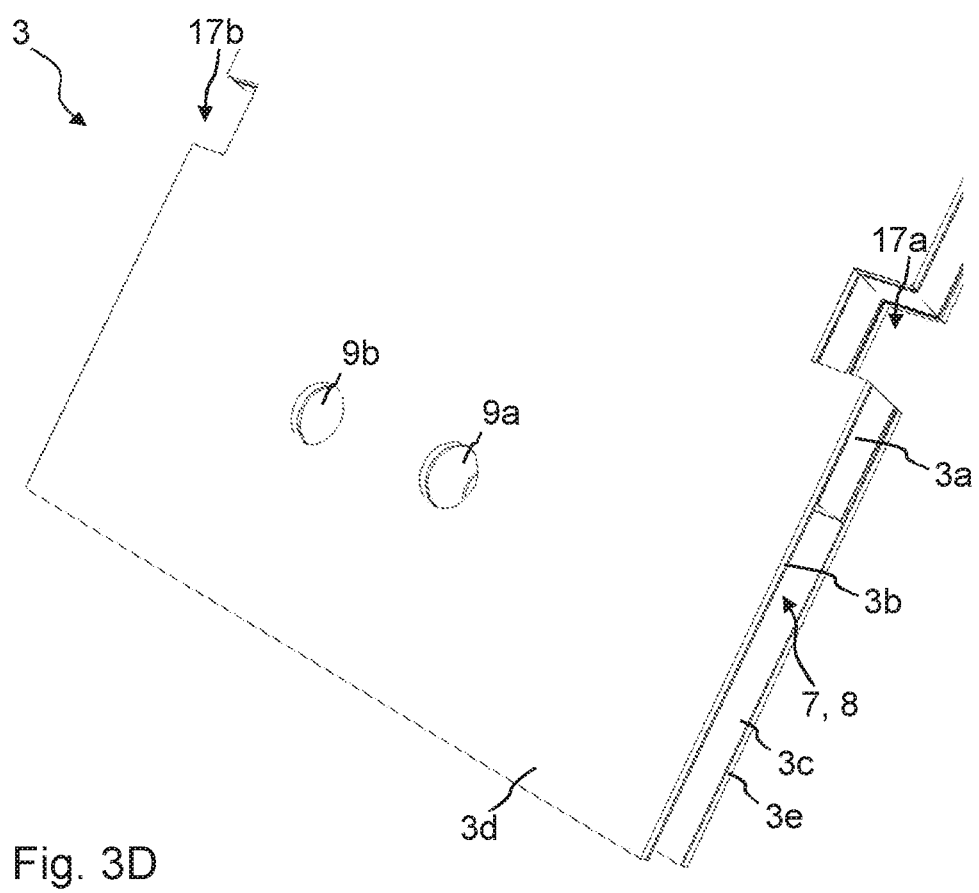
Figure 3E:
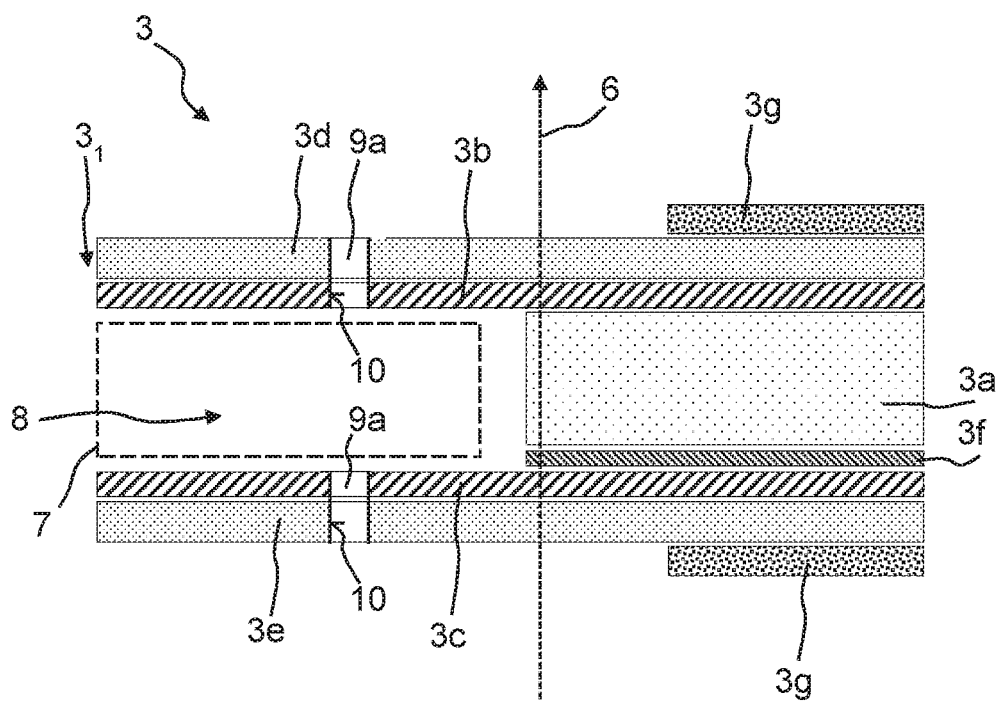

FIGS. 3B through 3D show different spatial configurations of board assembly 3. In addition to a first inner-conductor contact opening 9a, which, in FIG. 3B is formed only in first outer layer 3b, there is at least one second inner-conductor contact opening 9b, whose configuration corresponds to that of the at least one first inner-conductor contact opening 9a. In FIG. 3B, only three layers 3a, 3b, 3c are shown, whereas FIGS. 3C and 3D illustrate a spatial configuration which is shown in cross-sectional view in FIG. 3E (except for contact pads 3g).

In FIG. 3B, recess 7 was formed by milling or drilling. In principle, recess 7 could also have been punched or cut out of intermediate layer 3a by a punching process prior to manufacturing board assembly 3. In FIG. 3B, recess 7 is accessible from outside only at first side edge $3_1$. A second side edge 32 and a third side edge 33 of board assembly 3 extend to first side edge $3_1$ and each form an angle of preferably 90° therewith (deviations of less than 40°, 30°, 20°, 15°, 10°, 5° being included). In FIG. 3B, second and third side edges 32, 33 are inaccessible from the outside; i.e., closed.

This is not so in FIGS. 3C and 3D. Here, receiving space 7 is also accessible from second and third side edges 32, 33. As described earlier, inner-conductor contact openings 9a, 9b are not considered to be an access to receiving space 7. The board assembly 3 according to FIGS. 3C and 3D may be produced by a mechanical machining process, the cutting tool used being moved from second side edge 32 toward third side edge 33 at the level of intermediate layer 3a and with a corresponding cutting depth equal to the depth (length) of the receiving space. This process may also be carried out to form several stepped ledges; i.e., at several different depths.

In principle, the board assembly 3 according to FIGS. 3C and 3D could also be manufactured by a punching process, in which a portion of intermediate layer 3a is punched or cut out and removed prior to manufacturing board assembly 3. It would in principle also be possible to use less material for intermediate layer 3a than for the other layers 3b, 3c and 3d, 3e, respectively.

Board assembly 3 has a thickness preferably less than 15 mm, 13 mm, 11 mm, 9 mm, 8 mm, 7 mm, 6 mm, 5 mm, 4 mm, 3 mm, 2 mm and preferably greater than 1 mm, 2 mm, 3 mm, 4 mm, 5 mm, 6 mm, 7 mm, 8 mm, 9 mm, 10 mm. The depth (length) of cable-receiving space 8, i.e., from first side edge 3i to the completed intermediate layer 3a, is preferably less than 20 mm, 18 mm, 16 mm, 14 mm, 12 mm, 10 mm, 8 mm, 6 mm and preferably greater than 5 mm, 7 mm, 9 mm, 11 mm, 13 mm, 15 mm, 17 mm, 19 mm. The width of the recess; i.e., from the, for example, open second end 32 to the open third end 33, is preferably less than 50 mm, 40 mm, 30 mm, 26 mm, 22 mm, 18 mm, 14 mm, 10 mm, 6 mm and preferably greater than 8 mm, 12 mm, 16 mm, 20 mm, 24 mm, 28 mm, 35 mm, 45 mm.

Figure 4A:
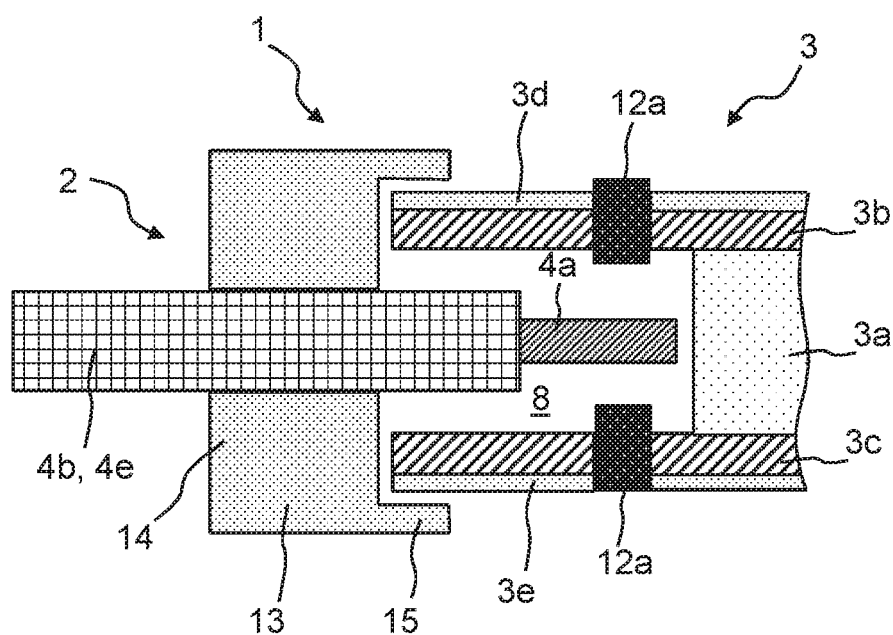
FIGS. 4A through 4D depict partially cross-sectional views of different exemplary embodiments of an inventive interconnection including the cable assembly and the board assembly.
Figure 4B:
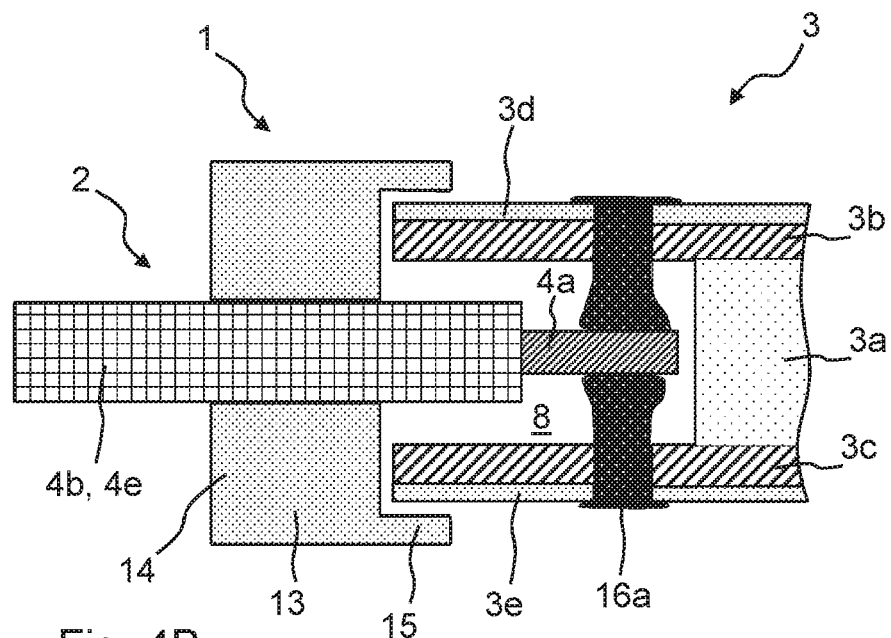
Figure 4C:
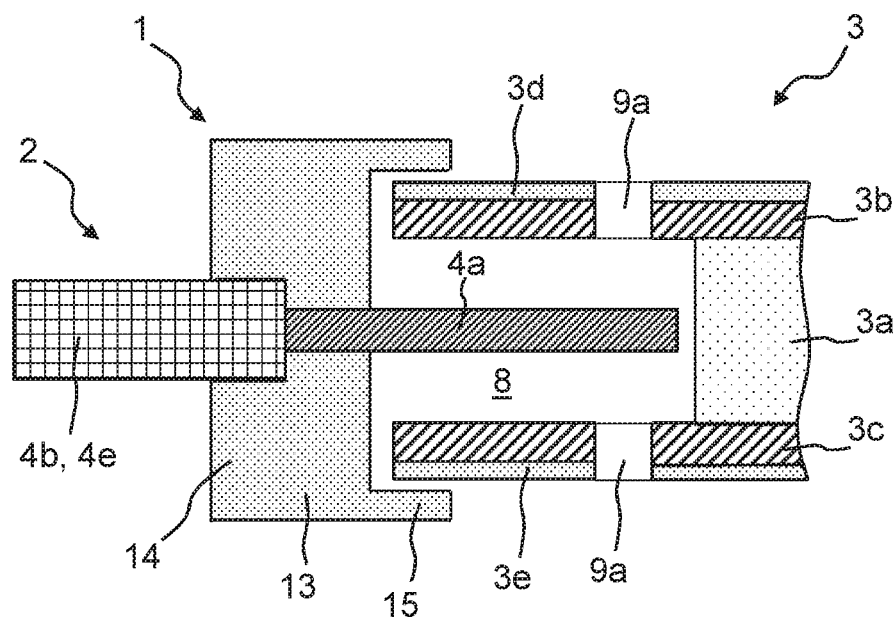
Figure 4D:
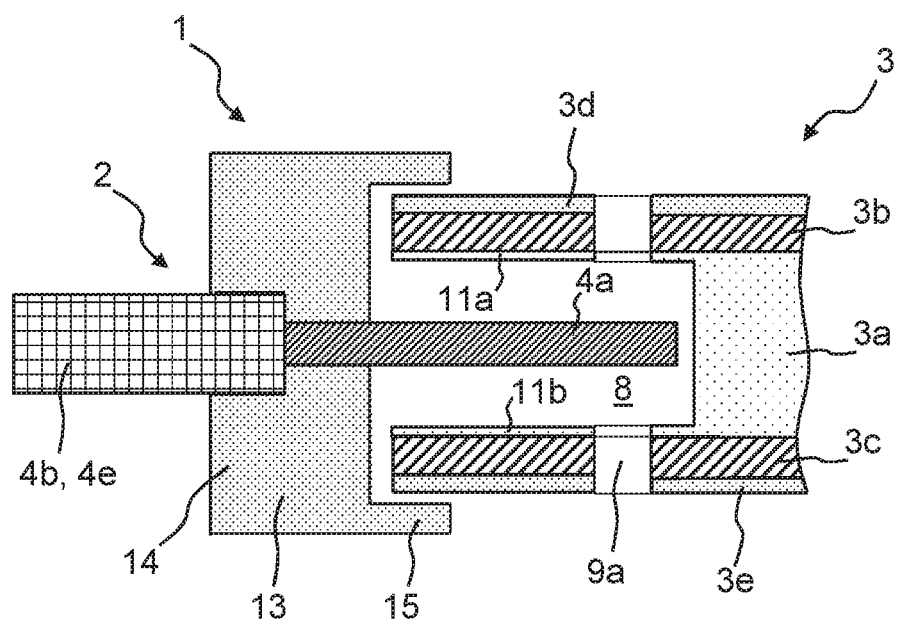
Figure 4E:
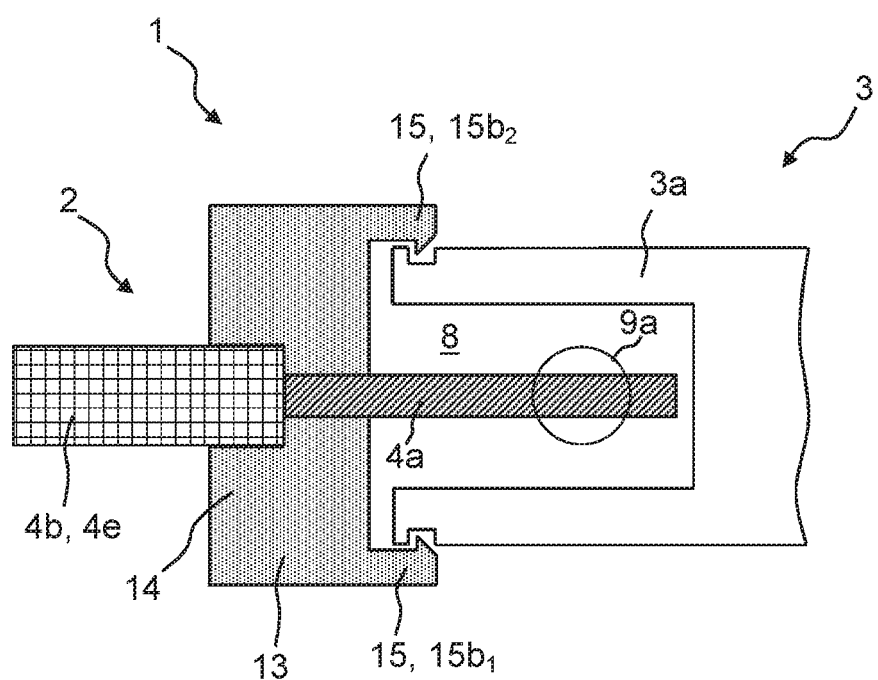
FIGS. 4E, 4F depict plan views of different exemplary embodiments of the inventive interconnection where the interconnection contacts the inner conductor of one or two cables.

FIGS. 4A through 4E show various ways of manufacturing the inventive interconnection 1. FIGS. 4A through 4D each show an at least partially (longitudinal) cross-sectional view through the inventive interconnection 1 including cable assembly 2 and board assembly 3. In contrast, FIG. 4E shows a plan view of the inventive interconnection 1, first and second outer layers 3b, 3c of board assembly 3 not being shown in this view.

In FIGS. 4A through 4E, cable assembly 2 includes only a first cable 2a including inner conductor 4a and dielectric 4b and/or outer sheath 4e. The at least one first cable 2a does not have an outer conductor 4d. It is also shown that the at least one first inner-conductor contact opening 9a is provided with at least one first inner-conductor solder deposit 12a.

The distance between inner conductor 4a and the at least one first inner-conductor contact opening 9a is not shown to scale in the drawing figures. In reality, inner conductor 4a is minimally (preferably less than 3 mm, 2 mm, 1 mm) spaced from first and/or second outer layer(s) 3b, 3c.

However, inner conductor 4a is disposed such that its end face is spaced apart from, i.e., not in contact with, an end face of intermediate layer 3a, The at least one first cable 2a of cable assembly 2 is inserted into recess 7, which is open toward first side edge 3i, and thus into cable-receiving space 8. The at least one first cable 2a is inserted into cable-receiving space 8 with a motion vector parallel, or mainly parallel, to first and/or second outer layer(s) 3b, 3c and to intermediate layer 3a. Inner conductor 4a of the at least one first cable 2a terminates in cable-receiving space 8, and the end of the exposed inner conductor 4a does not protrude from cable-receiving space 8.

FIG. 4a shows that cable assembly 2 further includes a cable-collecting and aligning device 13 having a main body 14. Cable-collecting and aligning device 13 is preferably immovably disposed on the at least one first cable 2a or on all cables 2a through 2d. In particular, cable-collecting and aligning device 13 is disposed on dielectric 4b and/or outer sheath 4e. Referring to FIG. 4C, it can be seen that cable-collecting and aligning device 13 may further surround inner conductor 4a.

Cable-collecting and aligning device 13 is made of a dielectric material, such as, for example, a plastic material. It may include a plastic housing, into which the at least one first cable 2a is inserted, whereupon the plastic housing is permanently closed. Preferably, however, the at least one first cable 2a is overmolded with a plastic material, thereby forming cable-collecting and aligning device 13. As will be explained further below, cable-collecting and aligning device 13 further includes a fastening device 15 adapted to secure cable-collecting and aligning device 13 to board assembly 3 in such a manner that the at least one first cable 2a or all cables 2a through 2d of cable assembly 2 can be inserted into cable-receiving space 8 in fixed positional relationship to one another and is/are disposed within cable-receiving space 8 in fixed positional relationship to one another. Fastening device 15 is made entirely without threads or screws and without solder.

The at least one first cable 2a or all cables 2a through 2d run(s) through main body 14 of cable-collecting and aligning device 13. Main body 14 includes, for example, a rectangular longitudinal cross section; i.e., is cuboidal in shape. In FIG. 4B, interconnection 1 is shown in a completed state. Inner-conductor solder deposit 12a shown in FIG. 4A was heated until it was molten and created a first soldered inner-conductor connection 16a via which inner conductor 4a of the at least one first cable 2a is electrically conductively soldered to a first inner-conductor connection region $9a_1$ of first and/or second outer layer(s) 3b, 3c, at least in the region of first inner-conductor contact opening 9a. As explained earlier, the term "outer layer 3b, 3c" is understood to refer to the entire electrically conductive metal layer, this metal layer being divided into different, galvanically isolated connection regions (e.g., first inner-conductor connection region $9a_1$).

First inner-conductor solder deposit 12a may be melted using a heated tip of a soldering iron or soldering device. However, it is preferred to use an inductive (contactless) soldering process.

The at least one first inner-conductor solder deposit 12a could in principle also be disposed as a solder ring or solder sleeve on inner conductor 4a of the at least one first cable 2a.

FIG. 4D further shows that recess 7 is formed only in intermediate layer 3a, but does not extend over the entire width of intermediate layer 3a. As described earlier, intermediate layer 3a is thereby divided into spaced-apart portions 11a, 11b extending toward first side edge 3i. First inner-conductor contact opening 9a extends through both portions 11a, 11b of intermediate layer 3a. Electrical contacting of inner conductor 4a to first inner-conductor connection region $9a_1$ of first and/or second outer layer(s) 3b, 3c is accomplished via inner wall 10 of inner-conductor contact opening 9a. This inner wall 10 is in particular plated with a metal coating.

These forwardly projected portions 11a, 11b of intermediate layer 3a ensure that no undesired electrical contact is made between inner conductor 4a and the different portions of first and/or second outer layer(s) 3b, 3c.

FIG. 4E depicts a plan view of interconnection 1. First and/or second outer layers 3b, 3c are not shown. Indicated is first inner-conductor contact opening 9a, which is shown with enlarged diameter. The diameter of first inner-conductor contact opening 9a is preferably smaller than the diameter of inner conductor 4a. As shown in FIG. 4E, inner conductor 4a of the at least one first cable 2a is inserted at first side edge $3_1$ into cable-receiving space 8 and, when viewed in a plan view looking at first or second outer layer 3b, 3c, is disposed below the at least one first inner-conductor contact opening 9a. The wording "below" should be understood to mean that when viewed in a plan view looking at first or second outer layer 3b, 3c, inner conductor 4a is can be seen through first inner-conductor contact opening 9a. However, inner conductor 4a does not have to extend centrally below first inner-conductor contact opening 9a. It could also extend off-center (at an offset) therebelow. In this context, the wording "below" is used with reference to both the first and the second outer layers 3b, 3c, which are each located "above" inner conductor 4a. In particular, therefore, when viewed in a plan view looking at first or second outer layer 3b, 3c, the line-of-side to inner conductor 4a is through first inner-conductor contact opening 9a.

Also shown is fastening device 15, which prevents cable assembly 2 from being detached or pulled off from board assembly 3 and provides strain relief for the at least one first cable 2a, so that first soldered inner-conductor connection 16a is not adversely affected. The type of fastening device 15 shown here will be described in greater detail below with reference to the embodiments discussed later.

Figure 4F:
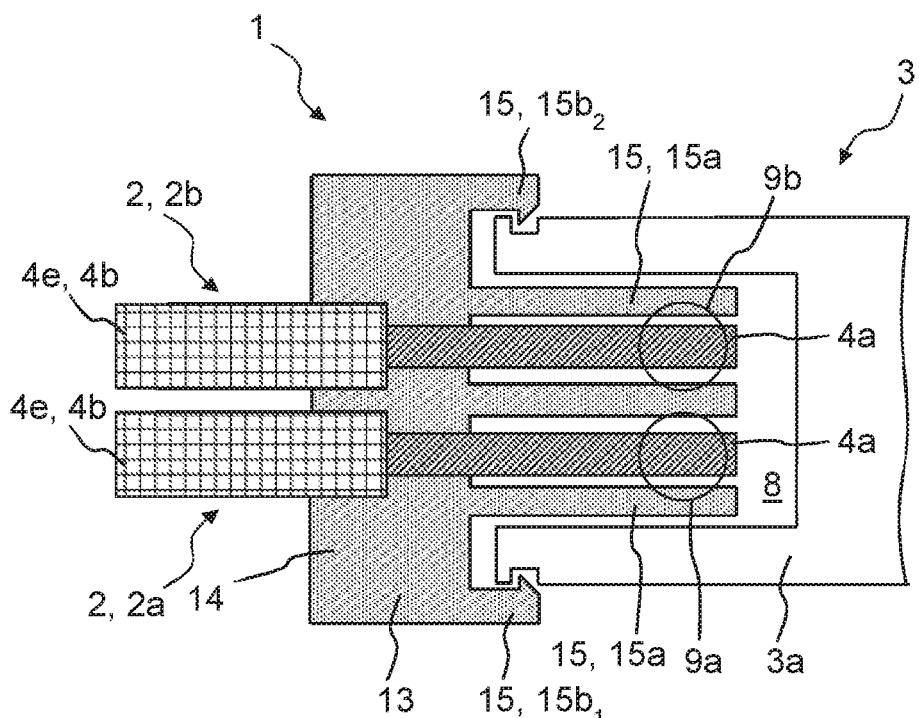

FIG. 4F shows that cable assembly 2 further includes at least one second cable 2b. As illustrated, second cable 2b includes an inner conductor 4a and a dielectric 4b and/or an outer sheath 4e. An outer conductor 4d is not provided here. Cables 2a, 2b of cable assembly 2 are arranged side by side. Preferably, they lie at least with their exposed inner conductors 4a in a common plane which is, in turn, parallel to board assembly 3 and parallel to the individual layers 3a through 3f Inner conductors 4a of the two cables 2a, 2b are galvanically isolated from each other and arranged in contact-free relationship with one another. Further provided is a second inner-conductor contact opening 9b of identical configuration as first inner-conductor contact opening 9a. The second inner-conductor contact opening also extends through first and/or the second outer layer(s) 3b, 3c and opens into cable-receiving space 8. Inner conductor 4a of the at least one second cable 2b is inserted at first side edge $3_1$ into cable-receiving space 8 and, when viewed in a plan view looking at first or second outer layer 3b, 3c, is disposed below the at least one second inner-conductor contact opening 9b. Inner conductor 4a of the at least one second cable 2b is electrically conductively soldered via a second soldered inner-conductor connection to a second inner-conductor connection region $9b_1$ (see FIG. 6B) of first and/or second outer layer(s) 3b, 3c, at least in the region of second inner-conductor contact opening 9b. First inner-conductor connection region $9a_1$ and second inner-conductor connection region $9b_1$ are galvanically isolated from each other.

Fastening device 15 of cable-collecting and aligning device 13 further includes a plurality of separating strips 15a extending from the at least one main body 14 toward board assembly 3 and terminating in cable-receiving space 8. Separating strips 15a are also made of a dielectric material. Cable-collecting and aligning device 13, together with its fastening device 15 and main body 14, is formed as a single piece and manufactured, in particular, in a plastic injection-molding process.

Separating strips 15a extend in the same direction as inner conductors 4a of the two cables 2a, 2b. Preferably, separating strips 15a project beyond the end faces; i.e., the ends, of inner conductors 4a. This means that during insertion of cable assembly 2; i.e., of inner conductors 4a and separating strips 15a, into cable-receiving space 8, separating strips 15a can move with their end faces into a position of abutment with intermediate layer 3a first.

Therefore, separating strips 15a flank inner conductors 4a of cables 2a, 2b. Each inner conductor 4a is preferably flanked by at least two separating strips 15a.

In principle, it would also be possible for a cable 2a, 2b to be flanked by only one separating strip 15a.

In FIG. 4F, separating strips 15a and inner conductors 4a of the two cables 2a, 2b terminate at the same lengthwise position.

Separating strips 15a have a thickness less than that of recess 7.

Figure 5:
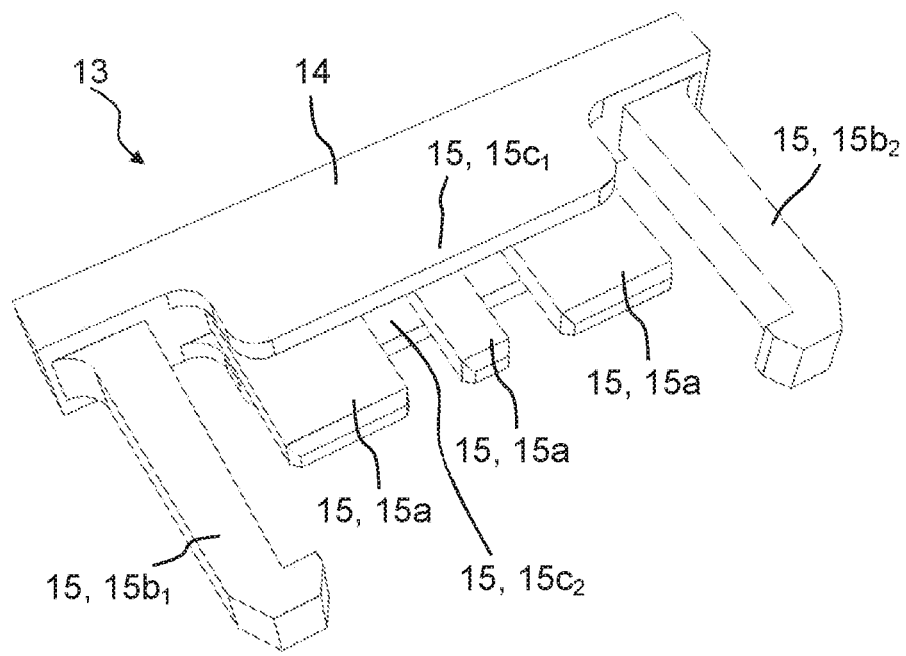
FIG. 5 shows a spatial representation of a cable-collecting and aligning device of the cable assembly.

FIG. 5 shows a spatial representation of cable-collecting and aligning device 13 of cable assembly 2. Separating strips 15a of fastening device 15 have already been described. The individual separating strips 15a may be of different width, but preferably have the same width. In the exemplary embodiment of FIG. 5, the two outer separating strips 15a have a greater width than central separating strip 15a. Separating strips 15a are flattened on all sides toward their free ends to facilitate insertion into receiving space 7.

Moreover, fastening device 15 further includes a first snap-in hook $15b_1$ and a second snap-in hook $15b2$. Snap-in hooks $15b_1$, $15b2$ originate from different regions of main body 14, in particular from different ends of main body 14 (but preferably on the same side of main body 14), and extend toward second and third side edges 32 and 33 of board assembly 3. Referring to FIG. 3D, there can be seen a first catch opening 17a and a second catch opening 17b. First catch opening 17a is formed at second side edge 32 and second catch opening 17b is formed at third side edge 33. Preferably, catch openings 17a, 17b extend through all layers 3a through 3f of board assembly 3. Catch openings 17a, 17b may, for example, be formed into board assembly 3 in a punching process subsequent to manufacturing board assembly 3. However, they could also be formed into the individual layers 3a through 3f before the individual layers 3a through 3f are glued and/or pressed together to form board assembly 3. Therefore, catch openings 17a, 17b are accessible not only from second and third side edges 32, 33, but also from above when viewed in a plan view looking at first and second outer layers 3b, 3c. Preferably, catch openings 17a, 17b are of cubical volume.

First snap-in hook $15b_1$ engages in first catch opening 17a, and second snap-in hook $15b2$ engages in second catch opening 17b. In particular, snap-in hooks $15b_1$, $15b_2$ engage behind a support shoulder formed by catch openings 17a, 17b in board assembly 3. Because of this, removal is only possible when urging snap-in hooks $15b_1$, $15b_2$ outwardly away from one another prior to forming the soldered connection(s). Snap-in hooks $15b_1$, $15b_2$ are generally configured to be flexible and should at least be capable of moving toward each other and away from each other. The forward portion of snap-in hooks $15b_1$, $15b_2$; i.e., the open end, is preferably L-shaped and, further preferably, is at least partially obliquely or conically enlarged toward main body 14, so that when making interconnection 1; i.e., during insertion of cable assembly 2 into board assembly 3, snap-in hooks $15b_1$, $15b_2$ are urged away from each other until the forward hook portions of the individual snap-in hooks $15b_1$, $15b_2$ engage into the respective catch openings 17a, 17b. Snap-in hooks $15b_1$, $15b_2$ have a thickness approximately equal to that of board assembly 3. However, the thickness may also be smaller or greater. Preferably, snap-in hooks $15b_1$, $15b_2$ are less flexible along longitudinal direction 6 than along the direction in which the snap-in hooks are moved toward each other or away from each other.

Fastening device 15 further includes a first and a second fastening tab $15c_1$, $15c_2$. The two fastening tabs $15c_1$, $15c_2$ extend away from main body 14 toward board assembly 3. Board assembly 3 is disposed with its first side edge $3_1$ between the two fastening tabs $15c_1$, $15c_2$. This means that first fastening tab $15c_1$ rests on first outer layer 3b and second fastening tab $15c_2$ rests on second outer layer 3c. Fastening tabs $15c_1$, $15c_2$ preferably extend less far toward board assembly 3 than snap-in hooks $15b_1$, $15b_2$. Moreover, fastening tabs $15c_1$, $15c_2$ extend less far toward board assembly 3 than separating strips 15a. In particular, fastening tabs $15c_1$, $15c_2$ do not overlap the first, respectively second, or the further inner-conductor contact openings 9a, 9b, 9c, 9d. Fastening tabs $15c_1$, $15c_2$ in particular do also not overlap the first, respectively second, or the further outer-conductor contact openings 18a, 18b, 18c, 18d, which will be discussed later herein.

Fastening tabs $15c_1$, $15c_2$ extend over the major portion (more than 50%) of the length of main body 14.

Separating strips 15a, snap-in hooks $15b_1$, $15b_2$ and fastening tabs $15c_1$, $15c_2$ all extend in the same direction.

Fastening device 15 further includes at least two securing pins 15d (FIG. 6A) which extend through the two fastening tabs $15c_1$, $15c_2$ and board assembly 3, and in particular through first and second outer layers 3b, 3c thereof, whereby cable assembly 2 is prevented from being pulled off from board assembly 3. Securing pins 15d are preferably press-fitted into place. Instead of using securing pins 15d, it could also be possible to glue fastening tabs $15c_1$, $15c_2$ to outer layers 3b, 3c.

Fastening tabs $15c_1$, $15c_2$ are the preferred fastening means of fastening device 15 because the use of snap-in hooks $15b_1$, $15b_2$ requires that board assembly 3 have a precisely defined width. When using fastening tabs $15c_1$, $15c_2$ locked in place by securing pins 15d, the board assembly may have any width.

Instead of the securing pins, it is also possible to use a ball catch below the respective fastening tabs $15c_1$, $15c_2$. In this case, a protrusion, in particular in the form of a ball, would project from the two fastening tabs $15c_1$, $15c_2$ toward first and second outer layers 3b, 3c, respectively; i.e., in longitudinal direction 6, and engage with a respective receiving hole in at least first and second outer layers 3b, 3c. While this type of fastening is not as effective as using securing pins 15d, it is less expensive to manufacture.

Figure 6A:
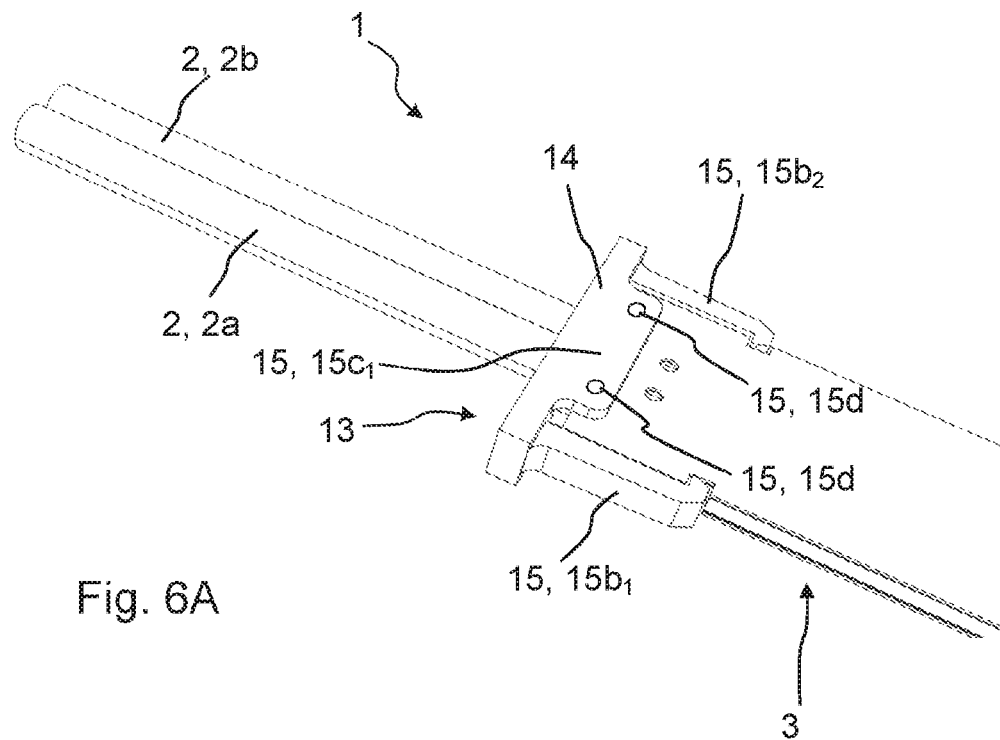
FIGS. 6A through 6C show different spatial representations of the interconnection.
Figure 6B:
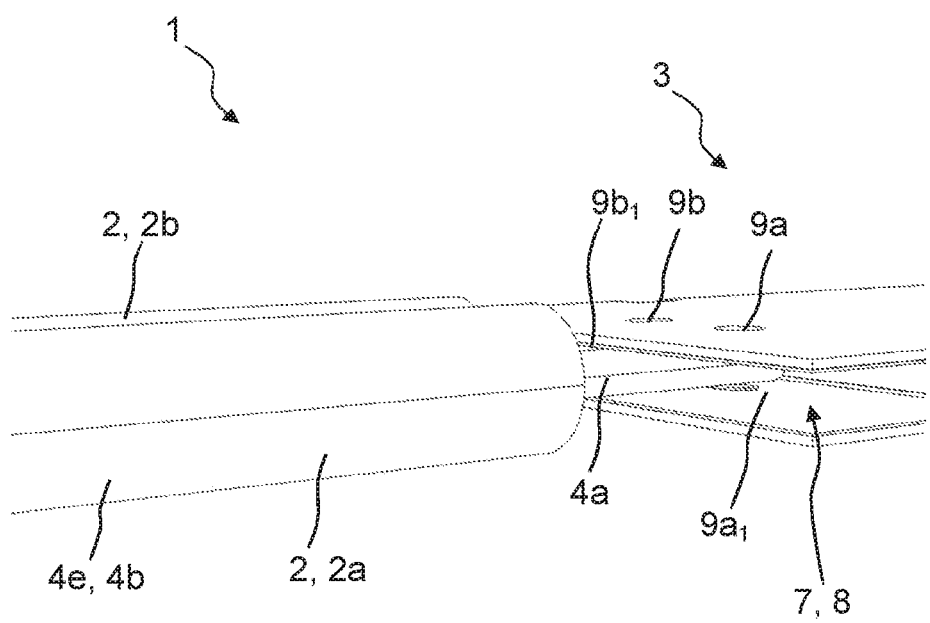
Figure 6C:
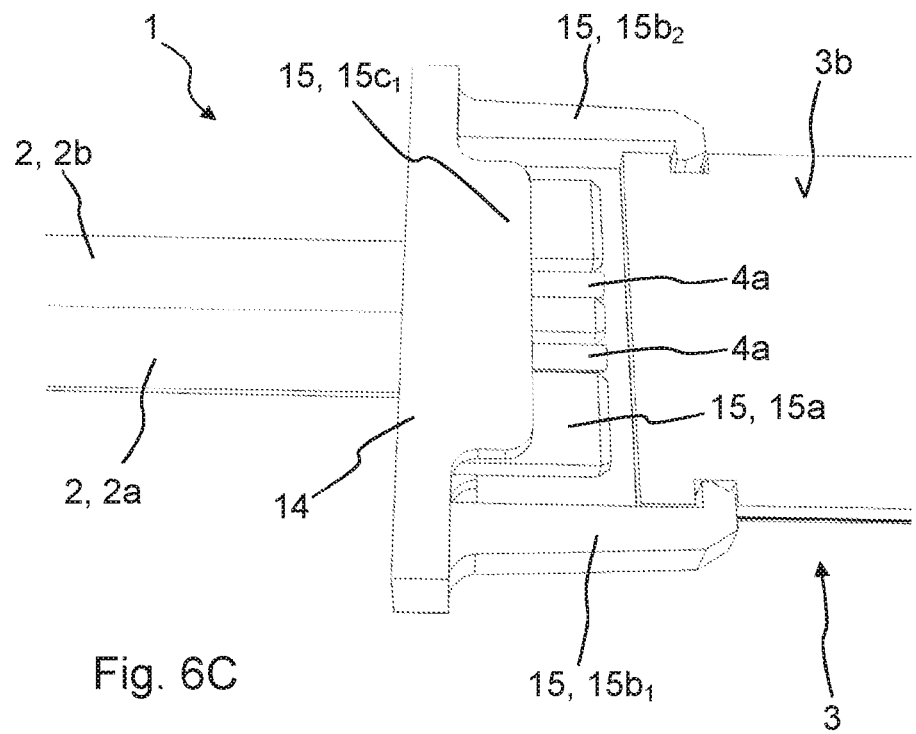

FIGS. 6A and 6C illustrate the use of cable-collecting and aligning device 13. In these figures, interconnection 1 is in the completed state. Thus, in FIG. 6A, cable assembly 2 includes two cables 2a, 2b. on which cable-collecting and aligning device 13 is immovably disposed (in the mounted state). In particular, cables 2a, 2b extend through main body 14. Fastening device 15 of cable-collecting and aligning device 13 engages with board assembly 3 at various locations, thus providing for strain relief and thereby preventing soldered inner-conductor connections 16a from being damaged, even when pulling on cables 2a, 2b.

FIG. 6B shows a view looking into the open receiving space 7 and illustrating the manner in which inner conductors 4a of cables 2a, 2b are arranged in cable-receiving space 8 below the respective inner-conductor contact openings 9a, 9b.

FIGS. 7 and 8A through 8D show a further exemplary embodiment of the inventive interconnection 1, where both inner conductor 4a and outer conductor 4d of the at least one first cable 2a are soldered to board assembly 3.

Figure 7:
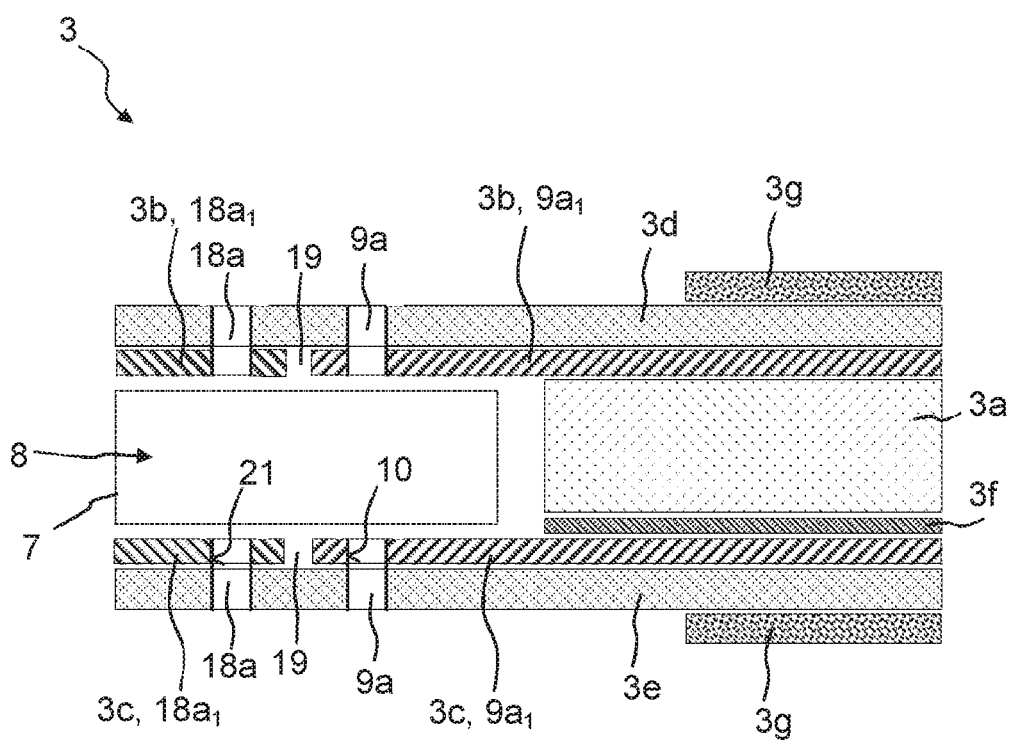
FIG. 7 depicts a simplified cross-sectional view of another exemplary embodiment of the board assembly, which may contact both an inner conductor and an outer conductor of a cable.

FIG. 7 shows a simplified cross-sectional view through a corresponding board assembly 3. Board assembly 3 further includes a first outer-conductor contact opening 18a which extends through first outer layer 3b and/or second outer layer 3c and opens into cable-receiving space 8. First outer-conductor contact opening 18a is preferably similar to first inner-conductor contact opening 9a in terms of configuration and manufacture. Outer-conductor contact opening 18a is disposed closer to first side edge 3i than first inner-conductor contact opening 9a. An inner wall 21 of first outer-conductor contact opening 18a is preferably plated with a metal coating.

FIG. 7 shows that first outer layer 3b and second outer layer 3c have different hatchings. These different hatchings are intended to illustrate that first outer layer 3b and second outer layer 3c include different connection regions $9a_1$, $18a_1$, such as an inner-conductor connection region $9a_1$ and an outer-conductor connection region $18a_1$. The two connection regions $9a_1$, $18a_1$ are galvanically isolated from each other by a gap 19. Preferably, however, they are formed of the same metal substrate. This means that first inner-conductor connection region $9a_1$ is galvanically isolated from first outer-conductor connection region $18a_1$. This gap 19 may be formed during build-up of first and/or second outer layer(s) 3b, 3c by omitting to build up the metal layer, or the metal layer may be removed later by an etching and/or milling process, thereby forming gap 19. Inner-conductor connection region $9a_1$ is preferably formed by a signal line, whereas outer-conductor connection region $18a_1$ is formed by a ground surface having a greater width than the signal line.

Figure 8A:
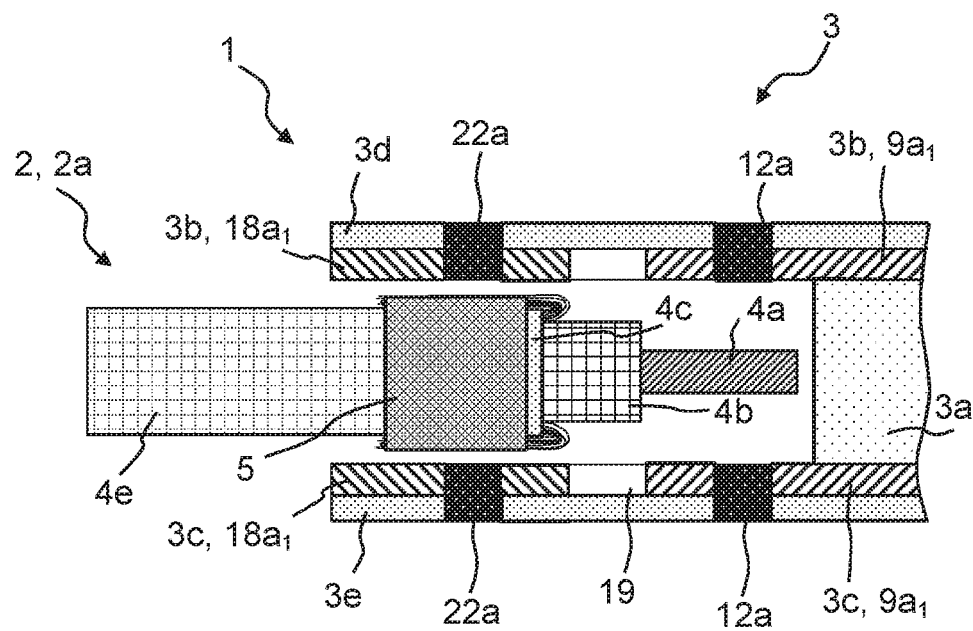
FIGS. 8A through 8C show partially cross-sectional views of various exemplary embodiments of an inventive interconnection where the interconnection serves both to contact the inner conductor of the cable and to contact the outer conductor of the cable.

FIG. 8A shows a first cable 2a including an inner conductor 4a, a dielectric 4b surrounding inner conductor 4a, an outer conductor 4d, and an outer sheath 4e surrounding the outer conductor. Outer sheath 4e and dielectric 4d are not electrically conductive. Outer conductor 4d includes a shielding braid whose shield wires are folded over or back; i.e., in the inserted condition toward first side edge 3i, as was described with reference to FIGS. 2A and 2B. Moreover, a metal foil 5 is placed on outer conductor 4d to hold the shield wires in place. This electrically conductive metal foil 5 may also be referred to as "soldering aid." In this case, the at least one first cable 2a is a coaxial cable. The shielding braid is preferably folded back away from the end of the at least one first cable 2a that is inserted in cable-receiving space 8.

In FIG. 8A, outer conductor 4d of the at least one first cable 2a is inserted at least partially; i.e., along a major portion of its length, in cable-receiving space 8 at first side edge 3i. When viewed in a plan view looking at first or second outer layer 3b, 3c, outer conductor 4d is disposed below the at least one first outer-conductor contact opening 18a. On the other hand, inner conductor 4a is disposed below the at least one first inner-conductor contact opening 9a.

In addition to the at least one first inner-conductor solder deposit 12a, FIG. 8A also shows at least one first outer-conductor solder deposit 22a. The at least one first outer-conductor solder deposit 22a is preferably placed into outer-conductor contact opening 18a. It could also be placed around outer conductor 4d.

Figure 8B:
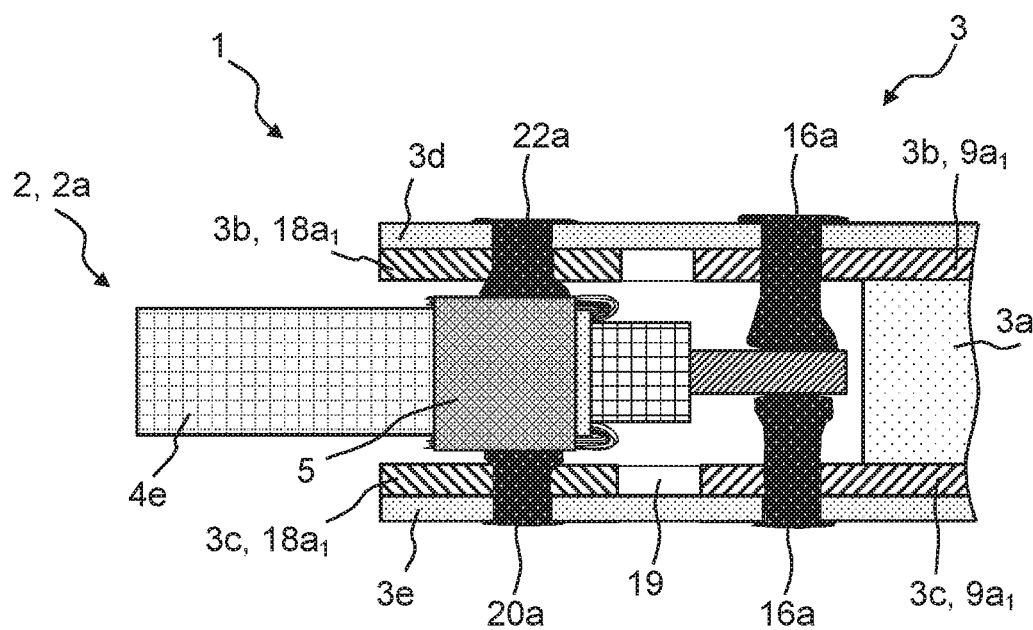

In FIG. 8B, these two solder deposit 12a, 22a are molten, thereby forming a first soldered inner-conductor connection 16a and a first soldered outer-conductor connection 20a to inner conductor 4a and outer conductor 4d, respectively. Thus, outer conductor 4d of the at least one first cable 2a is electrically conductively soldered via first soldered outer-conductor connection 20a to first outer-conductor connection region $18a_1$ of first and/or second outer layer(s) 3b, 3c, at least in the region of first outer-conductor contact opening 18a. The wording "in the region" should be understood to mean that the soldered connection may be formed, inter alia, at a position slightly spaced from first outer-conductor contact opening 18a. However, soldered outer-conductor connection 20a must nevertheless be formed in first outer-conductor connection region $18a_1$. Preferably, the first soldered outer-conductor connection is formed at a distance of less than 10 mm, 8 mm, 5 mm from first outer-conductor contact opening 18a. The same applies also to soldered inner-conductor connection 16a, which is disposed "in the region" of first inner-conductor contact opening 9a.

Figure 8C:
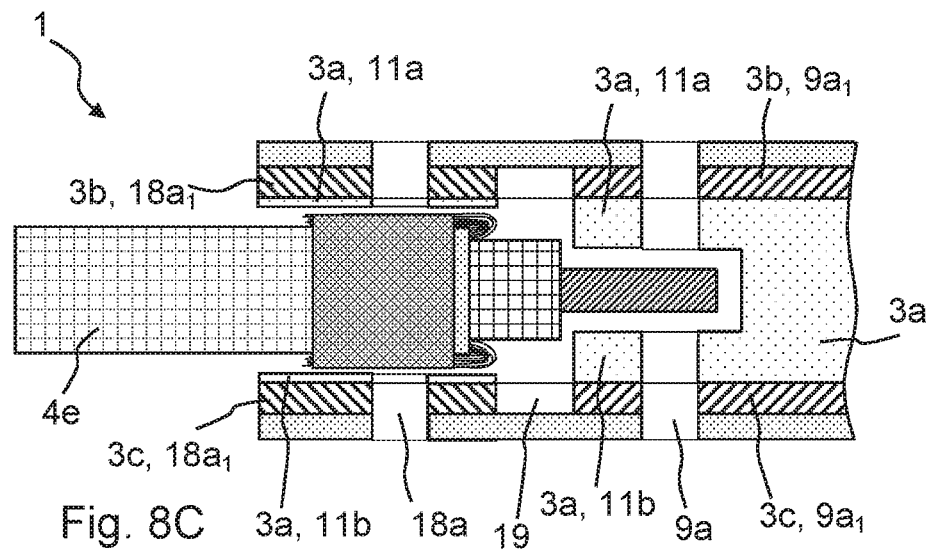

FIG. 8C further shows that the different portions 11a, 11b of intermediate layer 3a have different thicknesses along the cable insertion direction. In the region of cable connection space 8, in which inner conductor 4a of the at least one cable 2a is located when interconnection 1 is in the completed state, the two portions 11a, 11b are thicker than in the region of cable connection space 8 in which outer conductor 4d of the at least one first cable 2a is to be connected by soldering.

Figure 8D:
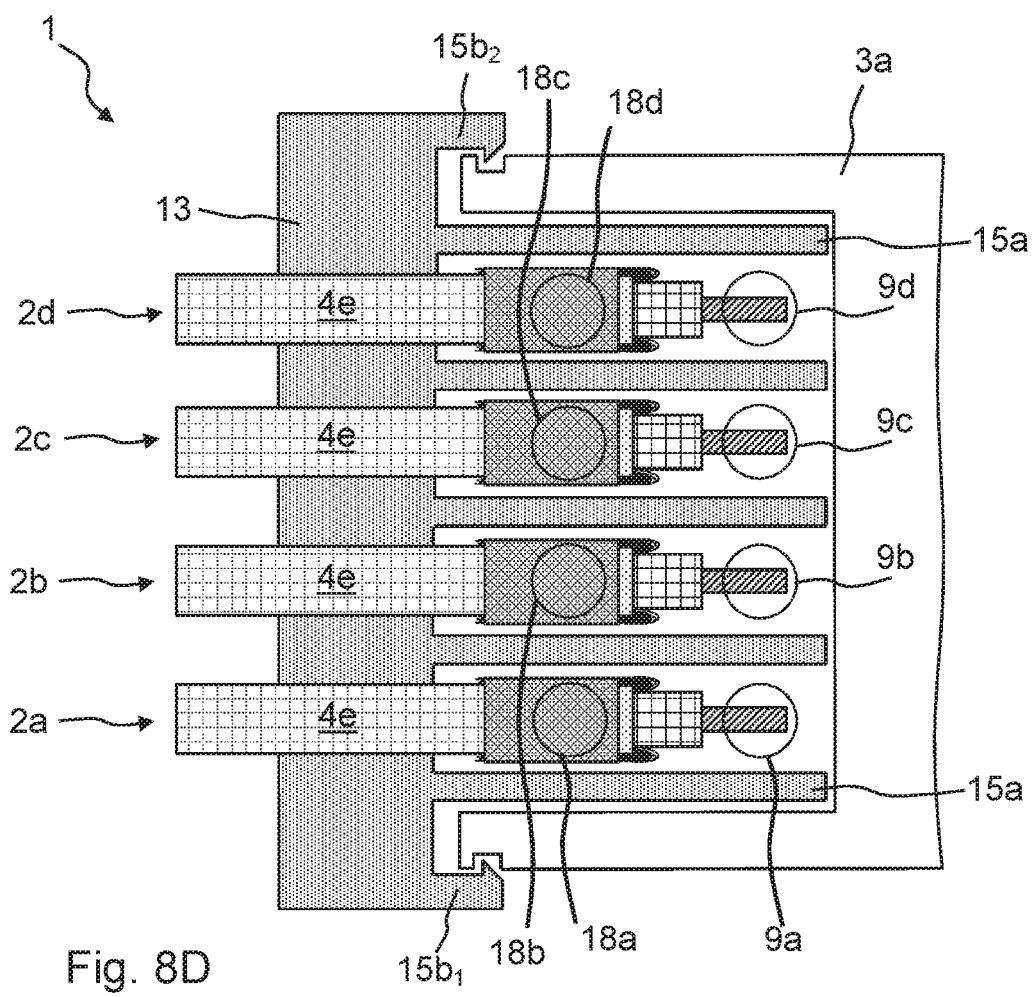
FIG. 8D depicts a plan view of an exemplary embodiment of the inventive interconnection which serves to contact the inner conductors and outer conductors of a plurality of cables.

FIG. 8D shows a plan view of the inventive interconnection 1, which electrically connects at least four cables 2a through 2*d* to corresponding connection regions $9a_1$, $18a_1$ and $9b_1$. Each cable 2*a* through 2*d* takes the form of a coaxial cable. The outer sheaths 4*e* of all cables 2*a* through 2*d* are held by cable-collecting and aligning device 13. Separating strips 15*a* are disposed between the exposed outer conductors 4*d* and the exposed inner conductors 4*a*. An inner-conductor contact opening 9*a*, 9*b*, 9*c*, 9*d* and an outer-conductor contact opening 18*a*, 18*b*, 18*c*, 18*d* are provided for each of the cables 2*a* through 2*d*. In the region of cable-receiving space 8, all cables 2*a* through 2*d* lie preferably in the same plane.

Here too, it is particularly advantageous that cable assembly 2 can be completely manufactured prior to making interconnection 1. The individual layers of cables 2*a* through 2*d* are exposed and prepared beforehand and non-rotatably secured by the corresponding cable-collecting and aligning device 13 in fixed positional relationship to each other. A cable assembly 2 prepared in this way can be easily inserted into cable-receiving space 8. Separating strips 15*a* prevent inner conductors 4*a* from entering into contact with the individual layers 3*a* through 3*f* of cable-receiving space 8. The inner-conductor and outer-conductor solder deposits 12*a*, 22*a* placed in the corresponding inner-conductor and outer-conductor contact openings 9*a* through 9*d* and 18*a* through 18*d* may be melted using an external heat source located, in particular, outside of board assembly 3, thereby soldering the individual cables 2*a* through 2*d* to the corresponding connection regions $9a_1$ and $18a_1$.

In principle, any number of cables 2*a* through 2*d* may be arranged side by side. Within certain limits, it would also be possible to arrange two cables 2*a*, 2*b* on top of one another, with inner conductor 4*a* of one cable 2*a* being soldered to first outer layer 3*b*, and inner conductor 4*a* of second cable 2*b* being soldered to second outer layer 3*c*. However, this requires that intermediate layer have a correspondingly large thickness.

The individual outer-conductor contact regions $18a_1$ of all cables 2*a* through 2*d* may be electrically conductively interconnected. This is not the case with inner-conductor contact regions $9a_1$, $9b_1$. In principle, it would also be possible to use a cable 2*a* through 2*d* configured as shown in FIG. 1B. In this case, a common outer conductor 4*d* would be used, which would surround all of the dielectrics 4*b* and respective inner conductors 4*a* of different cables 2*a* through 2*d*. Furthermore, such a cable 2*a* through 2*d* would not need to have a circular cross section, but could have sides of different length in cross section.

In addition to interconnection 1, board assembly 3 is also forms part of the present invention. This applies especially if first inner-conductor contact opening 9*a* has at least one first inner-conductor solder deposit 12*a*.

Figure 9:
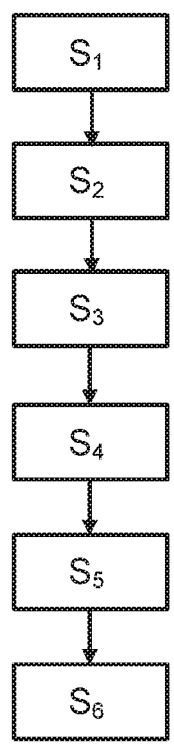
FIG. 9 shows an exemplary flow chart illustrating an inventive method for making the interconnection.

FIG. 9 shows a method for making interconnection 1 between board assembly 3 and cable assembly 2. In a first step $S_1$, board assembly 3 is manufactured, the board assembly including at least three layers 3*a*, 3*b*, 3*c* stacked on each other in longitudinal direction 6. At least dielectric intermediate layer 3*a* is disposed between a first outer layer 3*b* and a second outer layer 3*c*. First and/or second outer layers 3*b*, 3*c* are in particular metal layers (e.g., copper). A recess 7 is formed between first outer layer 3*b* and second outer layer 3*c*, thereby creating a cable-receiving space 8 that is accessible from first side edge $3_1$ of board assembly 3.

In a second step $S_2$, at least one first inner-conductor contact opening 9*a* is formed into board assembly 3, this first inner-conductor contact opening extending through first outer layer 3*b* and/or second outer layer 3*c* and opening into cable-receiving space 8. The at least one first inner-conductor contact opening 9*a* is in particular an electrical through-connection extending through both outer layers 3*b*, 3*c*. This electrical through-connection may be formed in a drilling process, for example. Also, inner wall 10 of first inner-conductor contact opening 9*a* may be plated.

In a third step $S_3$, inner conductor 4*a* of the at least one first cable 2*a* of cable assembly 2 is exposed. Of course, this step may also be performed prior to first or second step $S_1$, $S_2$.

In a fourth step $S_4$, at least one inner-conductor solder deposit 12*a* is placed into inner-conductor contact opening 9*a* and/or placed on exposed inner conductor 4*a* of the at least one first cable 2*a* of cable assembly 2.

In a fifth step $S_5$, inner conductor 4*a* of the at least one first cable 2*a* is inserted through first side edge 3*i* into cable-receiving space 8 so that, when seen in a plan view looking at first or second outer layer 3*b*, 3*c*; i.e., along longitudinal direction 6, inner conductor 4*a* of the at least one first cable 2*a* is disposed below the at least one first inner-conductor contact opening 9*a*.

In a sixth step $S_6$, inner-conductor solder deposit 12*a* is heated until it is molten and electrically conductively connects inner conductor 4*a* of the at least one first cable 2*a* via a first soldered inner-conductor connection 16*a* to a first inner-conductor connection region $9a_1$ of first and/or second outer layer(s) 3*b*, 3*c*, at least in the region of first inner-conductor contact opening 9*a*.

In a further, optional step $S_7$, interconnection 1 may be incorporated into a housing which is made of or includes a plastic material, for example, and/or is electrically conductive in order to reduce electromagnetic emissions from interconnection 1 and to enhance immunity to noise. Interconnection 1 is used, in particular, for the center console in vehicles, for example, to transmit display signals or USB signals to a display or a connector mounted thereon or to receive such signals therefrom. The vehicle is in particular a motor vehicle, such as a passenger car or truck, but may also be a train, an aircraft or a ship.

A user may, for example, connect a USB data storage device to the connector. In this case, preferably, board assembly 3 additionally carries at least one computer chip which supports the establishment of the USB connection. The connector could also be used to charge a mobile device of a user. In this case, at least a charging current (DC or AC) would be transmitted through inner conductor 4*a* of the at least one first cable 2*a*.

The present invention is not limited to the exemplary embodiments described herein. Within the scope of the present invention, all of the features described or shown in the drawing may be combined as desired.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An interconnection comprising:
a cable assembly including at least one first cable, the first cable having an inner conductor; and
a board assembly comprising:
   at least three layers stacked on each other in a longitudinal direction, the at least three layers including an intermediate layer and first and second outer layers, the intermediate layer being disposed between the first outer layer and the second outer layer, the at least three layers being directly or indirectly joined together, at least one of the first and second outer layers being electrically conductive, and the intermediate layer including a dielectric material;
   a recess disposed between the first outer layer and the second outer layer so as to form a cable-receiving space at a first side edge of the board assembly, the recess and cable-receiving space being formed by the first and second outer layers projecting beyond the intermediate layer at the first side edge; and
   at least one first inner-conductor contact opening extending through at least one of the first and second outer layers and opening into the cable-receiving space,
wherein the inner conductor of the at least one first cable is inserted at the first side edge into the cable-receiving space and is disposed at an offset in the longitudinal direction relative to the at least one first inner-conductor contact opening, and
wherein the inner conductor of the at least one first cable is electrically conductively soldered via a first soldered inner-conductor connection to a first inner-conductor connection region of at least one of the first and second outer layers, at least in a region of the first inner-conductor contact opening.

2. The interconnection as recited in claim 1, wherein the board assembly is a circuit board, and wherein the intermediate layer is thicker than the first and/or second outer layer alone or together.

3. The interconnection as recited in claim 1, wherein the first soldered inner-conductor connection is formed from a molten first inner-conductor solder deposit, and wherein first inner-conductor solder deposit is:
   a) disposed in the at least one first inner-conductor contact opening; and/or
   b) disposed on the inner conductor of the at least one first cable below the at least one first inner-conductor contact opening.

4. The interconnection as recited in claim 1, wherein:
the board assembly further includes:
   a) a first cover layer which is disposed on the first outer layer such that the first outer layer lies between the intermediate layer and the first cover layer, the first inner-conductor contact opening extending through the first cover layer; and/or
   b) a second cover layer which is disposed on the second outer layer such that the second outer layer lies between the intermediate layer and the second cover layer, the first inner-conductor contact opening extending through the second cover layer; and/or
the recess extends only over part of the thickness of the intermediate layer such that the intermediate layer includes two spaced-apart portions which are disposed at the first and second outer layers, respectively, and bound the cable-receiving space in the longitudinal direction, the first inner-conductor contact opening extending through at least one of the two spaced-apart portions; and/or
an inner wall of the first inner-conductor contact opening is plated with a metal coating.

5. The interconnection as recited in claim 1, wherein:
the at least one first cable of the cable assembly further includes an outer conductor which is galvanically isolated from the inner conductor by a dielectric;
at least one first outer-conductor contact opening extends through at least one of the first and second outer layers and opens into the cable-receiving space;
the first outer-conductor contact opening is disposed closer to the first side edge than the first inner-conductor contact opening;
the outer conductor of the at least one first cable is inserted at the first side edge into the cable-receiving space and is disposed at an offset in the longitudinal direction relative to the at least one first outer-conductor contact opening;
the outer conductor of the at least one first cable is electrically conductively soldered via a first soldered outer-conductor connection to a first outer-conductor connection region of at least one of the first and second outer layers, at least in a region of the first outer-conductor contact opening; and
the first inner-conductor connection region is galvanically isolated from the first outer-conductor connection region.

6. The interconnection as recited in claim 5, wherein the outer conductor of the at least one first cable includes a shielding braid, wherein the cable assembly includes at least one first metal foil, and wherein the first metal foil is placed around the shielding braid.

7. The interconnection as recited in claim 1, wherein:
the cable assembly includes at least one second cable having an inner conductor;
the cables of the cable assembly are arranged side by side;
at least one second inner-conductor contact opening extends through at least one of the first and second outer layers and opens into the cable-receiving space;
the inner conductor of the at least one second cable is inserted at the first side edge into the cable-receiving space and is disposed at an offset in the longitudinal direction relative to the at least one second inner-conductor contact opening;
the inner conductor of the at least one second cable is electrically conductively soldered via a second soldered inner-conductor connection to a second inner-conductor connection region of at least one of the first and second outer layers, at least in a region of the second inner-conductor contact opening; and a first inner-conductor connection region and the second inner-conductor connection region are galvanically isolated from each other.

8. The interconnection as recited in claim 7, wherein:
the at least one second cable of the cable assembly further includes an outer conductor which is galvanically isolated from the inner conductor by a dielectric;
at least one second outer-conductor contact opening extends through at least one of the first and second outer layers and opens into the cable-receiving space;
the second outer-conductor contact opening is disposed closer to the first side edge than the second inner-conductor contact opening;
the outer conductor of the at least one second cable is inserted at the first side edge into the cable-receiving space and is disposed at an offset in the longitudinal direction relative to the at least one second outer-conductor contact opening;
the outer conductor of the at least one second cable is electrically conductively soldered via a second soldered outer-conductor connection to a second outer-conductor connection region of at least one of the first and second outer layers, at least in a region of the second outer-conductor contact opening; and
the second inner-conductor connection region is galvanically isolated from the second outer-conductor connection region.

9. The interconnection as recited in claim 1, wherein:
the cable assembly includes a cable-collecting and aligning device which is made of or includes a plastic material and includes a main body;
the cable-collecting and aligning device is immovably disposed on the at least one first cable or on all cables;
the cable-collecting and aligning device includes at least one fastener formed on the main body; and
the at least one fastener is adapted to secure the cable-collecting and aligning device to the board assembly in such a manner that the at least one first cable or all cables of the cable assembly is/are disposed in a fixed position within the cable-receiving space.

10. The interconnection as recited in claim 9, wherein:
the at least one fastener further includes a first and a second snap-in hook;
the first and second snap-in hooks originate from different regions of the main body and extend toward a second and a third side edge of the board assembly, the second and third side edges of the board assembly extending at an angle toward different ends of the first side edge;
a first catch opening is formed at the second side edge and a second catch opening is formed at the third side edge; and
the first snap-in hook engages in the first catch opening, and the second snap-in hook engages in the second catch opening.

11. The interconnection as recited in claim 9, wherein:
the at least one fastener further includes a first and a second fastening tab;
the board assembly is disposed with the first side edge between the first and second fastening tabs, the first fastening tab resting on the first outer layer and the second fastening tab resting on the second outer layer;
the at least one fastener further includes at least one securing pin, the at least securing pin extending through the first and second fastening tabs and the board assembly such that the cable assembly is prevented from being pulled off from the board assembly; and/or a first ball catch is disposed between the first fastening tab and the first outer layer; and/or
a second ball catch is disposed between the second fastening tab and the second outer layer.

12. The interconnection as recited in claim 9, wherein:
the at least one fastener includes at least one separating strip extending from the main body toward the board assembly and terminating in the cable-receiving space;
the at least one first cable being flanked by the at least one separating strip or by at least two separating strips; and
the at least one separating strip extends approximately parallel to the at least one first cable.

13. A board assembly for making an interconnection, the board comprising:
at least three layers stacked on each other in a longitudinal direction, the at least three layers including an intermediate layer and first and second outer layers, the intermediate layer being disposed between the first outer layer and the second outer layer, the at least three layers being joined together, at least one of the first and second outer layers being electrically conductive, and the intermediate layer including a dielectric material;
a recess disposed between the first outer layer and the second outer layer so as to form a cable-receiving space at a first side edge of the board assembly, the recess and cable-receiving space being formed by the first and second outer layers projecting beyond the intermediate layer at the first side edge;
at least one first inner-conductor contact opening extending through at least one of the first and second outer layers and opening into the cable-receiving space; and
at least one first inner-conductor solder deposit disposed in the first inner-conductor contact opening.

14. A method for making an interconnection between a board assembly and a cable assembly, the method comprising:
manufacturing a board assembly including at least three layers stacked on each other in a longitudinal direction, the at least three layers including a dielectric intermediate layer and first and second outer layers, the intermediate layer being disposed between the first outer layer and the second outer layer, at least one of the first and second outer layers being electrically conductive, a first recess being formed between the first outer layer and the second outer layer so as to form a cable-receiving space at a first side edge of the board assembly, the recess and cable-receiving space being formed by the first and second outer layers projecting beyond the intermediate layer at the first side edge;
forming at least one first inner-conductor contact opening into the board assembly, the first inner-conductor contact opening extending through at least one of the first and second outer layers and opening into the cable-receiving space;
exposing an inner conductor of at least one first cable of the cable assembly;
placing at least one first inner-conductor solder deposit into the at least one first inner-conductor contact opening and/or on the exposed inner conductor of the at least one first cable of the cable assembly;
inserting the inner conductor of the at least one first cable at the first side edge into the cable-receiving space in such a manner that the inner conductor of the at least one first cable is disposed at an offset in the longitudinal direction relative to the at least one first inner-conductor contact opening; and heating the at least one first inner-conductor solder deposit until it is molten and electrically conductively connects the inner conductor of the at least one first cable via a first soldered inner-conductor connection to a first inner-conductor connection region of at least one of the first and second outer layers, at least in a region of the first inner-conductor contact opening.

15. The interconnection as recited in claim 1, wherein the inner conductor of the at least one first cable is spaced apart from the intermediate layer.

16. An interconnection comprising:
a cable assembly including at least one first cable, the first cable having an inner conductor; and
a board assembly comprising:
  at least three layers stacked on each other in a longitudinal direction, the at least three layers including an intermediate layer and first and second outer layers, the intermediate layer being disposed between the first outer layer and the second outer layer, the at least three layers being directly or indirectly joined together, at least one of the first and second outer layers being electrically conductive, and the intermediate layer including a dielectric material;
  a recess disposed between the first outer layer and the second outer layer so as to form a cable-receiving space at a first side edge of the board assembly; and
  at least one first inner-conductor contact opening extending through at least one of the first and second outer layers and opening into the cable-receiving space,
wherein the inner conductor of the at least one first cable is inserted at the first side edge into the cable-receiving space and is disposed at an offset in the longitudinal direction relative to the at least one first inner-conductor contact opening,
wherein the inner conductor of the at least one first cable is electrically conductively soldered via a first soldered inner-conductor connection to a first inner-conductor connection region of at least one of the first and second outer layers, at least in a region of the first inner-conductor contact opening, and
wherein:
  the board assembly further includes:
  a) a first cover layer which is disposed on the first outer layer such that the first outer layer lies between the intermediate layer and the first cover layer, the first inner-conductor contact opening extending through the first cover layer; and/or
  b) a second cover layer which is disposed on the second outer layer such that the second outer layer lies between the intermediate layer and the second cover layer, the first inner-conductor contact opening extending through the second cover layer; and/or
  the recess extends only over part of the thickness of the intermediate layer such that the intermediate layer includes two spaced-apart portions which are disposed at the first and second outer layers, respectively, and bound the cable-receiving space in the longitudinal direction, the first inner-conductor contact opening extending through at least one of the two spaced-apart portions; and/or
  an inner wall of the first inner-conductor contact opening is plated with a metal coating.

17. An interconnection comprising:
a cable assembly including at least one first cable, the first cable having an inner conductor; and
a board assembly comprising:
  at least three layers stacked on each other in a longitudinal direction, the at least three layers including an intermediate layer and first and second outer layers, the intermediate layer being disposed between the first outer layer and the second outer layer, the at least three layers being directly or indirectly joined together, at least one of the first and second outer layers being electrically conductive, and the intermediate layer including a dielectric material;
  a recess disposed between the first outer layer and the second outer layer so as to form a cable-receiving space at a first side edge of the board assembly; and
  at least one first inner-conductor contact opening extending through at least one of the first and second outer layers and opening into the cable-receiving space,
wherein the inner conductor of the at least one first cable is inserted at the first side edge into the cable-receiving space and is disposed at an offset in the longitudinal direction relative to the at least one first inner-conductor contact opening,
wherein the inner conductor of the at least one first cable is electrically conductively soldered via a first soldered inner-conductor connection to a first inner-conductor connection region of at least one of the first and second outer layers, at least in a region of the first inner-conductor contact opening, and
wherein:
  the at least one first cable of the cable assembly further includes an outer conductor which is galvanically isolated from the inner conductor by a dielectric;
  at least one first outer-conductor contact opening extends through at least one of the first and second outer layers and opens into the cable-receiving space;
  the first outer-conductor contact opening is disposed closer to the first side edge than the first inner-conductor contact opening;
  the outer conductor of the at least one first cable is inserted at the first side edge into the cable-receiving space and is disposed at an offset in the longitudinal direction relative to the at least one first outer-conductor contact opening;
  the outer conductor of the at least one first cable is electrically conductively soldered via a first soldered outer-conductor connection to a first outer-conductor connection region of at least one of the first and second outer layers, at least in a region of the first outer-conductor contact opening; and
  the first inner-conductor connection region is galvanically isolated from the first outer-conductor connection region.

18. An interconnection comprising:
a cable assembly including at least one first cable, the first cable having an inner conductor; and
a board assembly comprising:
  at least three layers stacked on each other in a longitudinal direction, the at least three layers including an intermediate layer and first and second outer layers, the intermediate layer being disposed between the first outer layer and the second outer layer, the at least three layers being directly or indirectly joined together, at least one of the first and second outer layers being electrically conductive, and the intermediate layer including a dielectric material;
a recess disposed between the first outer layer and the second outer layer so as to form a cable-receiving space at a first side edge of the board assembly; and
at least one first inner-conductor contact opening extending through at least one of the first and second outer layers and opening into the cable-receiving space,
wherein the inner conductor of the at least one first cable is inserted at the first side edge into the cable-receiving space and is disposed at an offset in the longitudinal direction relative to the at least one first inner-conductor contact opening,
wherein the inner conductor of the at least one first cable is electrically conductively soldered via a first soldered inner-conductor connection to a first inner-conductor connection region of at least one of the first and second outer layers, at least in a region of the first inner-conductor contact opening, and
wherein:
the cable assembly includes at least one second cable having an inner conductor;
the cables of the cable assembly are arranged side by side;
at least one second inner-conductor contact opening extends through at least one of the first and second outer layers and opens into the cable-receiving space;
the inner conductor of the at least one second cable is inserted at the first side edge into the cable-receiving space and is disposed at an offset in the longitudinal direction relative to the at least one second inner-conductor contact opening;
the inner conductor of the at least one second cable is electrically conductively soldered via a second soldered inner-conductor connection to a second inner-conductor connection region of at least one of the first and second outer layers, at least in a region of the second inner-conductor contact opening; and
a first inner-conductor connection region and the second inner-conductor connection region are galvanically isolated from each other.

19. An interconnection comprising:
a cable assembly including at least one first cable, the first cable having an inner conductor; and
a board assembly comprising:
at least three layers stacked on each other in a longitudinal direction, the at least three layers including an intermediate layer and first and second outer layers, the intermediate layer being disposed between the first outer layer and the second outer layer, the at least three layers being directly or indirectly joined together, at least one of the first and second outer layers being electrically conductive, and the intermediate layer including a dielectric material;
a recess disposed between the first outer layer and the second outer layer so as to form a cable-receiving space at a first side edge of the board assembly; and
at least one first inner-conductor contact opening extending through at least one of the first and second outer layers and opening into the cable-receiving space,
wherein the inner conductor of the at least one first cable is inserted at the first side edge into the cable-receiving space and is disposed at an offset in the longitudinal direction relative to the at least one first inner-conductor contact opening,
wherein the inner conductor of the at least one first cable is electrically conductively soldered via a first soldered inner-conductor connection to a first inner-conductor connection region of at least one of the first and second outer layers, at least in a region of the first inner-conductor contact opening, and
wherein:
the cable assembly includes a cable-collecting and aligning device which is made of or includes a plastic material and includes a main body;
the cable-collecting and aligning device is immovably disposed on the at least one first cable or on all cables;
the cable-collecting and aligning device includes at least one fastener formed on the main body; and
the at least one fastener is adapted to secure the cable-collecting and aligning device to the board assembly in such a manner that the at least one first cable or all cables of the cable assembly is/are disposed in a fixed position within the cable-receiving space.

* * * * *

UNITED STATES PATENT AND TRADEMARK OFFICE
CERTIFICATE OF CORRECTION

Page 1 of 1

PATENT NO. : 10,541,479 B2
APPLICATION NO. : 16/029693
DATED : January 21, 2020
INVENTOR(S) : Martin Huber and Robert Hofmann It is certified that error appears in the above-identified patent and that said Letters Patent is hereby corrected as shown below:

On the Title Page

Item (72) Inventors:
The correct inventors are, in order, --Martin Huber, Obing (DE); Robert Hofmann, Truchtlaching (DE); Johannes Trae, Muehldorf am Inn (DE)--

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*